(12) United States Patent
Kunikiyo

(10) Patent No.: US 6,754,098 B2
(45) Date of Patent: Jun. 22, 2004

(54) SEMICONDUCTOR MEMORY DEVICE

(75) Inventor: Tatsuya Kunikiyo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/261,776

(22) Filed: Oct. 2, 2002

(65) Prior Publication Data
US 2003/0198096 A1 Oct. 23, 2003

(30) Foreign Application Priority Data
Apr. 12, 2002 (JP) .......................... 2002-110746

(51) Int. Cl.[7] .......................... G11C 11/00; G11C 11/14; G11C 11/15
(52) U.S. Cl. .......................... 365/158; 365/171; 365/173
(58) Field of Search ................... 365/158, 171, 365/173

(56) References Cited

U.S. PATENT DOCUMENTS

| 4,356,523 | A | * | 10/1982 | Yeh | 365/158 |
|---|---|---|---|---|---|
| 5,986,925 | A | * | 11/1999 | Naji et al. | 365/171 |
| 6,225,933 | B1 | | 5/2001 | Salter et al. | |
| 6,252,471 | B1 | * | 6/2001 | Salter et al. | 365/158 |
| 6,462,983 | B2 | * | 10/2002 | Katti et al. | 365/158 |
| 6,549,455 | B2 | * | 4/2003 | Yamada | 365/158 |

FOREIGN PATENT DOCUMENTS

| JP | 4-369878 | 12/1992 |
|---|---|---|
| JP | 2000-20634 | 1/2000 |

* cited by examiner

Primary Examiner—Trong Phan
(74) Attorney, Agent, or Firm—Oblon, Spivak, McClelland, Maier & Neustadt, P.C.

(57) ABSTRACT

A filter (FT1) is a low-pass filter in which a magnetic tunnel resistance element (MR) and a capacitor (C) are connected to each other in the shape of L. Further, in the filter (FT1), terminals (T1, T2) serve as input terminals and terminals (T3, T4) serve as output terminals. A current to change the magnetization direction of the magnetic tunnel resistance element (MR) is supplied through a current source (IP). With such a constitution, it is possible to provide an analog circuit, including a filter, a amplifier or the like, which can correct variations in value of elements caused by process variations in the manufacturing process.

9 Claims, 28 Drawing Sheets

| D3 | D2 | D1 | D0 |                                      |
|----|----|----|----|--------------------------------------|
| 0  | 0  | 0  | 0  | (RL+RL)+RL+2/3×RL                    |
| 0  | 0  | 0  | 1  | (RL+RL)+RL+2RL×RH/(RH+2RL)           |
| 0  | 0  | 1  | 0  | (RL+RL)+RH+2RH×RL/(RL+2RH)           |
| 0  | 0  | 1  | 1  | (RL+RL)+RL+2/3×RH                    |
| 0  | 1  | 0  | 0  | (RL+RL)+RH+2/3×RL                    |
| 0  | 1  | 0  | 1  | (RL+RL)+RH+2RL×RH/(RH+2RL)           |
| 0  | 1  | 1  | 0  | (RL+RL)+RH+2RH×RL/(RL+2RH)           |
| 0  | 1  | 1  | 1  | (RL+RL)+RH+2/3×RH                    |
| 1  | 0  | 0  | 0  | (RH+RH)+RL+2/3×RL                    |
| 1  | 0  | 0  | 1  | (RH+RH)+RL+2RL×RH/(RH+2RL)           |
| 1  | 0  | 1  | 0  | (RH+RH)+RL+2RH×RL/(RL+2RH)           |
| 1  | 0  | 1  | 1  | (RH+RH)+RL+2/3×RH                    |
| 1  | 1  | 0  | 0  | (RH+RH)+RH+2/3×RL                    |
| 1  | 1  | 0  | 1  | (RH+RH)+RH+2RL×RH/(RH+2RL)           |
| 1  | 1  | 1  | 0  | (RH+RH)+RH+2RH×RL/(RL+2RH)           |
| 1  | 1  | 1  | 1  | (RH+RH)+RH+2/3×RH                    |

F I G . 1 3
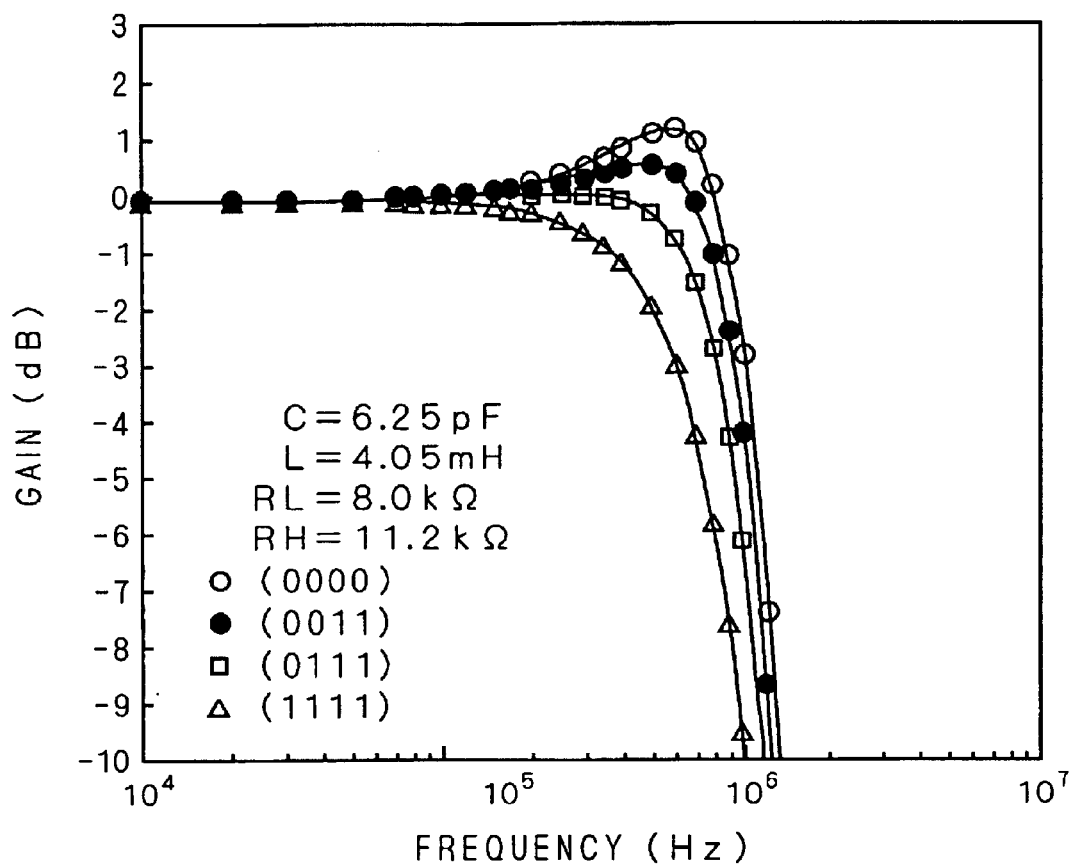
F I G . 1 4
| D3 | D2 | D1 | D0 | Q |
|----|----|----|----|-------|
| 0  | 0  | 0  | 0  | 0.868 |
| 0  | 0  | 1  | 1  | 0.809 |
| 0  | 1  | 1  | 1  | 0.734 |
| 1  | 1  | 1  | 1  | 0.620 |

$y = -(x1 + x2 + x3)$ $y = -\int x\,dt$ $y = kx$

SEMICONDUCTOR MEMORY DEVICE

BACKGROUND OF THE INVENTION

1. Field of the Invention

The present invention relates to a semiconductor memory device, and more particularly to a semiconductor device having a magnetic tunnel resistance element as a resistance element.

2. Description of the Background Art

First, a constitution of a general-type filter will be discussed.

L-Shaped Primary Filter

FIGS. 39 and 40 show a low-pass filter (hereinafter, referred to as "LPF") in which a resistor R and a capacitor C are connected to each other in the shape of L and a high-pass filter (hereinafter, referred to as "HPF").

In FIG. 39, the resistor R is interposed between terminals T1 and T3 and the capacitor C is interposed between a wire connecting the terminals T2 and T4 and an end portion of the resistor R on the side of the terminal T3.

In FIG. 40, the capacitor C is interposed between the terminals T1 and T3 and the resistor R is interposed between the wire connecting the terminals T2 and T4 and an electrode of the capacitor C on the side of the terminal T3. Further, the terminals T1 and T2 serve as input terminals and the terminals T3 and T4 serve as output terminals.

Furthermore, as shown in FIG. 41, a filter in which impedances Z1 and Z2 are connected to each other in the shape of L is referred to as an L-shaped primary filter, which includes the constitutions of FIGS. 39 and 40.

The characteristic of the filter is described by transfer function representing the ratio of an output signal to an input signal of the filter and expressed by the following equation (1):

$$H(s) = \frac{V\text{out}(s)}{V\text{in}(s)} \tag{1}$$

In Eq. (1), $s=j\omega$ where j represents an imaginary unit and $\omega$ represents an angular frequency.

The damping characteristic is expressed by the following equation (2):

$$20 \log_{10}|H(j\omega)| (\text{dB}) \tag{2}$$

From Eq. (2), it is found that one-digit attenuation results in reduction by 20 dB (20 dB/dec).

The reason why the filter of FIG. 41 is referred to as an L-shaped primary filter is that the denominator or numerator of the transfer function of the filter is described by the linear function of s (=jω).

In the cases of filters of FIGS. 39 and 40, for example, the transfer functions $H_{LPF}(s)$ and $H_{HPF}(s)$ are expressed by the following equations (3) and (4), respectively:

$$H_{LPF}(s) = \frac{\frac{1}{sC}}{R + \frac{1}{sC}} = \frac{1}{1 + sCR} \tag{3}$$

$$H_{LPF}(s) = \frac{R}{R + \frac{1}{sC}} = \frac{sCR}{1 + sCR} \tag{4}$$

FIGS. 42 and 43 are schematic Bode diagrams of the LPF and the HPF. In FIGS. 42 and 43, the horizontal axis represents the frequency in logarithmic representation and the vertical axis represents the damping factor in logarithmic representation.

The frequency characteristic of the LPF shown in FIG. 42 indicates that the input signal is outputted without being attenuated in a low-frequency region and the input signal is attenuated and little outputted in a high-frequency region.

On the other hand, the frequency characteristic of the HPF shown in FIG. 43 indicates that the input signal is outputted without being attenuated in the high-frequency region and the input signal is attenuated and little outputted in the low-frequency region.

L-Shaped Secondary Filter

FIG. 44 shows an example of filter which is referred to as an L-shaped secondary filter.

In FIG. 44, the resistor R and an inductor L are interposed, being connected in series, between the terminals T1 and T3 and the capacitor C is interposed between the wire connecting the terminals T2 and T4 and an end portion of the inductor L on the side of the terminal T3.

The reason why the filter of FIG. 44 is referred to as a secondary filter is that the denominator or numerator of the transfer function of the filter is described by the quadratic function of s (=jω).

The filter of FIG. 44 is an LPF, and its transfer function H(s) is expressed by the following equation (5):

$$H(s) = \frac{\frac{1}{sC}}{R + sL + \frac{1}{sC}} = \frac{1}{s^2 LC + sRC + 1} = \frac{\omega_p^2}{s^2 + \frac{\omega_p}{Q}s + \omega_p^2} \tag{5}$$

From the following equations (6) and (7) and the relation $s=j\omega$, the transfer function H(s) is transformed into the equation (8) as follows:

$$\omega_p = \frac{1}{\sqrt{LC}} \tag{6}$$

$$Q = \frac{1}{R}\sqrt{\frac{L}{C}} \tag{7}$$

$$H(s) = \frac{\omega_p^2}{\omega_p^2 - \omega^2 + j\frac{\omega_p}{Q}\omega} \tag{8}$$

From Eq. (8), it is found that the transfer function indicates the resonance characteristic when $\omega=\omega_p$. The absolute value of the transfer function at that time is equal to Q-value (selectivity). In other words, it is preferable that the Q-value should be made as small as possible in order to suppress resonance.

FIG. 45 is a schematic view of the Bode diagram of the LPF shown in FIG. 44. FIG. 45, where the horizontal axis represents the angular frequency of Eq. (6) and the vertical axis represents the damping factor, shows the Bode diagram in the cases where the Q-value is 0.8, 2 and 10.

As shown in FIG. 45, it is found that the characteristic of the filter is distorted near the resonance frequency $\omega_p$ as the Q-value becomes larger.

The LPF of FIG. 44 is represented by using the impedances Z1, Z2 and Z3 as shown in FIG. 46, and it is possible to form an LPF and an HPF by changing the combinations of passive elements (resistor, capacitor, inductor) which are assigned to these impedances.

The transfer function of various secondary filters is expressed, in general, by the following equations (9), (10), (11) and (12):

$$H(s) = \frac{b}{s^2 + as + b} \quad (9)$$

$$H(s) = \frac{s^2}{s^2 + as + b} \quad (10)$$

$$H(s) = K\frac{fs}{s^2 + as + b} \quad (11)$$

$$H(s) = K\frac{s^2 + b}{s^2 + as + b} \quad (12)$$

Eqs. (9) and (10) represent the transfer functions of the LPF and the HPF, respectively, and Eqs. (11) and (12) represent the transfer functions of a band-pass filter (hereinafter, referred to as "BPF") and a band-reject filter (hereinafter, referred to as "BRF"), respectively.

Another example of the L-shaped secondary filter is such a constitution as shown in FIG. 47 in which two L-shaped primary filters of FIG. 41 are connected to each other.

As shown in FIG. 47, the impedance Z1 is interposed between the terminals T1 and T3 and the impedance Z2 is interposed between the wire connecting the terminals T2 and T4 and an end portion of the impedance Z1 on the side of the terminal T3. Further, the impedance Z3 is interposed between the terminal T3 and a terminal T5 and the impedance Z4 is interposed between a wire connecting the terminal T4 and a terminal T6 and an end portion of the impedance Z3 on the side of the terminal T5. The terminals T1 and T2 serve as input terminals and the terminals T5 and T6 serve as output terminals.

The filter of FIG. 47 is also referred to as the L-shaped secondary filter since the denominator and numerator of its transfer function are described by the quadratic function.

When the passive elements are assigned so that the following relations should be satisfied, Z1=R1, Z2=1/sC2, Z3=R3 and Z4=1/sC4, for example, an LPF is formed. In this case, reference signs R1 and R3 represent resistance values, signs C2 and C4 represent capacitance values and s=jω.

Further, when the passive elements are assigned so that the following relations should be satisfied, Z1=1/sC1, Z2=R2, Z3=1/sC3 and Z4=R4, for example, an HPF is formed. In this case, reference signs R2 and R4 represent resistance values and signs C1 and C3 represent capacitance values.

Furthermore, when the passive elements are assigned so that the following relations should be satisfied, Z1=1/sC1, Z2=R2, Z3=1/sC3 and Z4=R4, for example, the ante-stage L-shaped filter forms an HPF and the post-stage L-shaped filter forms an LPF. The Bode diagram of this case is shown in FIG. 48.

In FIG. 48, the horizontal axis represents the frequency in logarithmic representation and the vertical axis represents the damping factor in logarithmic representation. As shown in FIG. 48, the input signal is outputted only in a certain frequency region. A filter having such a function is a band-pass filter (BPF).

Further, in FIG. 47, even when the passive elements are assigned so that the following relations should be satisfied, Z1=R2, Z2=1/sC1, Z3=1/sC4 and Z4=R3, a like BPF is achieved.

T-Shaped Bridge Secondary Filter

FIG. 49 shows an example of filter referred to as a T-shaped bridge secondary filter.

As shown in FIG. 49, the impedances Z1 and Z3 are interposed, being connected in series, between the terminals T1 and T3 and the impedance Z2 is interposed between the wire connecting the terminals T2 and T4 and a wire connecting the impedances Z1 and Z3. Further, an impedance Z4 is connected in parallel to the impedances Z1 and Z3 between the terminals T1 and T3.

In this constitution, when the passive elements are assigned so that the following relations should be satisfied, Z1=1/sC1, Z2=R2, Z3=1/sC3 and Z4=R4, for example, the impedances Z1, Z2 and Z3 form an HPF and the impedance Z4 forms an LPF.

Specifically, when the input signal is in the high-frequency region, the input signal is outputted through the HPF consisting of the impedances Z1, Z2 and Z3, and when the input signal in the low-frequency region, the input signal is outputted through the impedance Z4. In other words, the impedances Z1, Z2 and Z3 serve as the HPF and the impedance Z4 serves as the LPF. As a result, in a certain frequency region, no input signal is outputted. The Bode diagram of this case is shown in FIG. 50.

In FIG. 50, the horizontal axis represents the frequency in logarithmic representation and the vertical axis represents the damping factor in logarithmic representation. As shown in FIG. 50, no input signal is outputted only in a certain frequency region. A filter having such a function is a band-reject filter (BRF).

Further, even when the passive elements are assigned so that the following relations should be satisfied, Z1=R1, Z2=1/sC2, Z3=R3 and Z4=1/sC4, a BRF having like function is achieved.

Twin T-Shaped Bridge Secondary Filter

FIG. 51 shows an example of filter referred to as a twin T-shaped bridge secondary filter. As shown in FIG. 51, the impedances Z4 and Z6 are interposed, being connected in series, and the impedances Z1 and Z3 is interposed, being connected in series, between a terminal T10 serving as an input terminal and a terminal T20 serving as an output terminal. Further, an impedance Z5 is interposed between a wire connecting the impedances Z4 and Z6 and the ground potential, and the impedance Z2 is interposed between a wire connecting the impedances Z1 and Z3 and the ground potential.

In this constitution, when the passive elements are assigned so that the following relations should be satisfied, Z1=R1, Z2=1/sC2, Z3=R3, Z4=1/sC4, Z5=R5, Z6=1/sC6 and C1=C3=C5/2, R2=2R4=2R6, the filter shown in FIG. 51 serves as the BRF.

Secondary Active Filter (Sallen Key Type)

A filter including active elements such as a transistor, an op-amp (operational amplifier), a negative resistance element and a gyrator is referred to as an active filter. FIG. 52 shows an example of active filter referred to as a Sallen key secondary filter.

As shown in FIG. 52, the impedances Z1 and Z2 are interposed, being connected in series, between the terminal T10 serving as the input terminal and a noninverting input terminal of an op-amp OP, and an output terminal of the op-amp is connected to the terminal T20.

Further, the impedance Z3 is interposed between a wire connecting the impedance Z2 and the noninverting input terminal and the ground potential, and the impedance Z4 is interposed between a connecting node between the impedances Z1 and Z2 and the output terminal of the op-amp OP.

Furthermore, the resistors R2 and R1 are interposed, being connected in series, between the output terminal of the op-amp OP and the ground potential, and the connecting node between the resistors R2 and R1 is connected to an inverting input terminal of the op-amp OP.

In this constitution, when the passive elements are assigned in such combinations of the impedances Z1 to Z4 shown in the following table 1, an LPF, an HPF and a BPF can be achieved.

TABLE 1

|    | LPF   | HPF   | BPF      |
|----|-------|-------|----------|
| Z1 | R1    | 1/sC1 | R1       |
| Z2 | R2    | 1/sC2 | 1/sC2    |
| Z3 | 1/sC3 | R3    | R3//1/sC3 |
| Z4 | 1/sC4 | R4    | R4       |

In the case of LPF, when the K-value gets closer to 3 in a case where the relation 1+R2/R1=K holds, it becomes difficult to adjust the Q-value since the Q-value becomes larger.

FIG. 53 shows the relation between the K-value and the Q-value in the case of LPF. As shown in FIG. 53, it is found that the Q-value increases without limit as the K-value gets closer to 3. Further, as discussed earlier, since the characteristic of the filter is distorted near the resonance frequency as the Q-value becomes larger, it is preferable to set the values of the resistors R1 and R2 so that the K-value should not get closer to 3.

Secondary Active Filter (Infinite Feed Back Type)

Another example of active filter is a constitution of an infinite feed back secondary filter shown in FIG. 54.

As shown in FIG. 53, the impedances Z1 and Z3 are interposed, being connected in series, between the terminal T10 serving as the input terminal and the inverting input terminal of the op-amp (operational amplifier) OP, and the output terminal of the op-amp OP is connected to the terminal T20. Further, the noninverting input terminal of the op-amp OP is connected to the ground potential.

Furthermore, the impedance Z2 is interposed between the connecting node between the impedances Z1 and Z3 and the output terminal of the op-amp OP, and the impedance Z4 is interposed between the connecting node between the impedances Z1 and Z3 and the ground potential.

The impedance Z5 is interposed between a wire connecting the impedance Z2 and the output terminal of the op-amp OP and a wire connecting the impedance Z3 and the inverting input terminal of the op-amp OP.

In this constitution, when the passive elements are assigned in such combinations of the impedances Z1 to Z5 shown in the following table 2, an LPF, an HPF and a BPF can be achieved.

TABLE 2

|    | LPF   | HPF   | BPF   |
|----|-------|-------|-------|
| Z1 | R1    | 1/sC1 | R1    |
| Z2 | R2    | 1/sC2 | 1/sC2 |
| Z3 | R3    | 1/sC3 | 1/sC3 |
| Z4 | 1/sC4 | R4    | R4    |
| Z5 | 1/sC5 | R5    | R5    |

Secondary Active Filter (Biquad)

As another example of active filter, a Tow-Thomas biquad circuit, which is a kind of Biquadratic circuit (abbreviated as "Biquad") using three op-amps is shown in FIG. 55.

In FIG. 55, between the terminal T10 serving as the input terminal and the terminal T20 serving as the output terminal, op-amps OP1, OP2 and OP3 are connected in series.

Further, the resistor R1 is interposed between the terminal T10 and an inverting input terminal of the op-amp OP1, the resistor R2 is interposed between the output terminal of the op-amp OP1 and an inverting input terminal of the op-amp OP2 and the resistor R3 is interposed between the output terminal of the op-amp OP2 and an inverting input terminal of the op-amp OP3. Furthermore, noninverting input terminals of the op-amps OP1 to OP3 are connected to the ground potential.

A capacitor C1 and the resistor R4 are interposed, being connected in parallel, between the inverting input terminal and the output terminal of the op-amp OP1, a capacitor C2 is interposed between the inverting input terminal and the output terminal of the op-amp OP2, the resistor R5 is interposed between the inverting input terminal and the output terminal of the op-amp OP3, and the resistor R6 is interposed between the inverting input terminal of the op-amp OP1 and the output terminal of the op-amp OP3.

The characteristic feature of such a filter lies in higher Q-value, small element sensitivity, easy adjustment, realization of HPF output, LPF output and BPF output in a circuit and the like.

For example, the output terminal of the op-amp OP1 serves to make a BPF output in response to the input signal, and the output terminal of the op-amp OP2 serves to make an LPF output in response to the input signal.

Further, FIG. 56 shows a KHN Biquad circuit which is a kind of Biquad using three op-amps.

In FIG. 56, the op-amps OP1, OP2 and OP3 are connected in series between the terminal T10 serving as the input terminal and the terminal T20 serving as the output terminal.

The resistor R1 is interposed between the terminal T10 and the inverting input terminal of the op-amp OP1, the resistor R2 is interposed between the output terminal of the op-amp OP1 and the inverting input terminal of the op-amp OP2, and the resistor R3 is interposed between the output terminal of the op-amp OP2 and the inverting input terminal of the op-amp OP3. Further, the noninverting input terminals of the op-amps OP2 and OP3 are connected to the ground potential.

Furthermore, the resistor R4 is interposed between the inverting input terminal and the output terminal of the operational amplifier OP1, the capacitor C1 is interposed between the inverting input terminal and the output terminal of the op-amp OP2, the capacitor C2 is interposed between the inverting input terminal and the output terminal of the op-amp OP3, the resistor R5 is interposed between the noninverting input terminal of the op-amp OP1 and the output terminal of the op-amp OP2, and the resistor R6 is interposed between the inverting input terminal of the op-amp OP1 and the output terminal of the op-amp OP3.

The KHN Biquad circuit is named from the capitals of Kerwin, Huelsman and Newcomb, in which the output terminal of the op-amp OP1 serves to make an HPF output in response to the input signal, the output terminal of the op-amp OP2 serves to make a BPF output in response to the input signal, and the output terminal of the op-amp OP3 serves to make an LPF output in response to the input signal.

As discussed above, the filter uses such resistance elements, and the conventional resistance elements use metal, doped polysilicon, switch capacitor, OTA (Operational transconductance amplifier) and the like.

Whatever is used as the material of the resistance elements, however, since variations in resistance value are inevitably caused by process variations in a manufacturing process, there is a problem that even the same filters should have variations in frequency characteristics.

Further, though a variable resistance may be useful in order to suppress the variations in frequency characteristics among the filters, since it is difficult to form a small-sized variable resistance, the idea is not actually realized. This also applies to semiconductor integrated circuits other than filters.

SUMMARY OF THE INVENTION

It is an object of the present invention is to provide an analog circuit including filters, amplifiers or the like, which can correct the variations in value of elements caused by the process variations in the manufacturing process.

The present invention is directed to a semiconductor memory device. According to the present invention, the semiconductor memory device at least includes an analog circuit having a variable resistance unit which consists of a plurality of magnetic tunnel resistance elements and obtains a plurality of kinds of resistance values by using the plurality of magnetic tunnel resistance elements singly or in combination and changing the resistance values of the plurality of magnetic tunnel resistance elements by single ones or combinations, being capable of changing the resistance values of the plurality of magnetic tunnel resistance elements by single ones or combinations with a plurality of control signals, a control unit for outputting the plurality of control signals, and a memory cell array. The semiconductor memory device adopts address signal multiplexing in which an address terminal is properly used in a time-division manner. The control unit uses an address decoder of the memory cell array also as a decoder for resistance-value control of at least one of the plurality of magnetic tunnel resistance elements. The address decoder is controlled on the basis of a magnetic tunnel resistance element control signal which is given to the address terminal in a time-division manner, for the resistance-value control of the at least one magnetic tunnel resistance element.

Since the analog circuit includes the variable resistance unit capable of obtaining a plurality of kinds of resistance values, it is possible to control circuit characteristics by changing the resistance values of the variable resistance unit. Further, since the address decoder of the memory cell array is used also as a decoder for resistance-value control of the magnetic tunnel resistance element and the address decoder is controlled on the basis of the magnetic tunnel resistance element control signal, it is possible to suppress upsizing of a semiconductor memory device incorporating the analog circuit using the magnetic tunnel resistance.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a graph showing characteristics of the L-shaped secondary low-pass filter in accordance with the first preferred embodiment of the present invention;

FIG. 14 is a table showing relations between the combinations of the control signals and corresponding Q-values;

FIGS. 42 and 43 are graphs each showing characteristics of the L-shaped primary filter;

FIG. 44 is a view showing a configuration of a general-type L-shaped secondary low-pass filter;

FIG. 51 is a view showing a configuration of a twin T-shaped bridge secondary filter;

FIG. 52 is a view showing a configuration of an active filter;

FIG. 53 is a graph used for explanation of an operation of the active filter;

FIG. 54 is a view showing a configuration of an infinite feed back secondary filter; and FIGS. 55 and 56 are views each showing a configuration of the active filter.

DESCRIPTION OF THE PREFERRED EMBODIMENTS

The characteristic feature of the present invention lies in that a filter or an amplifier includes at least one magnetic tunnel resistance element. Then, first, discussion will be made on a magnetic tunnel resistance element.

Magnetic Tunnel Resistance Element

Figure 1:
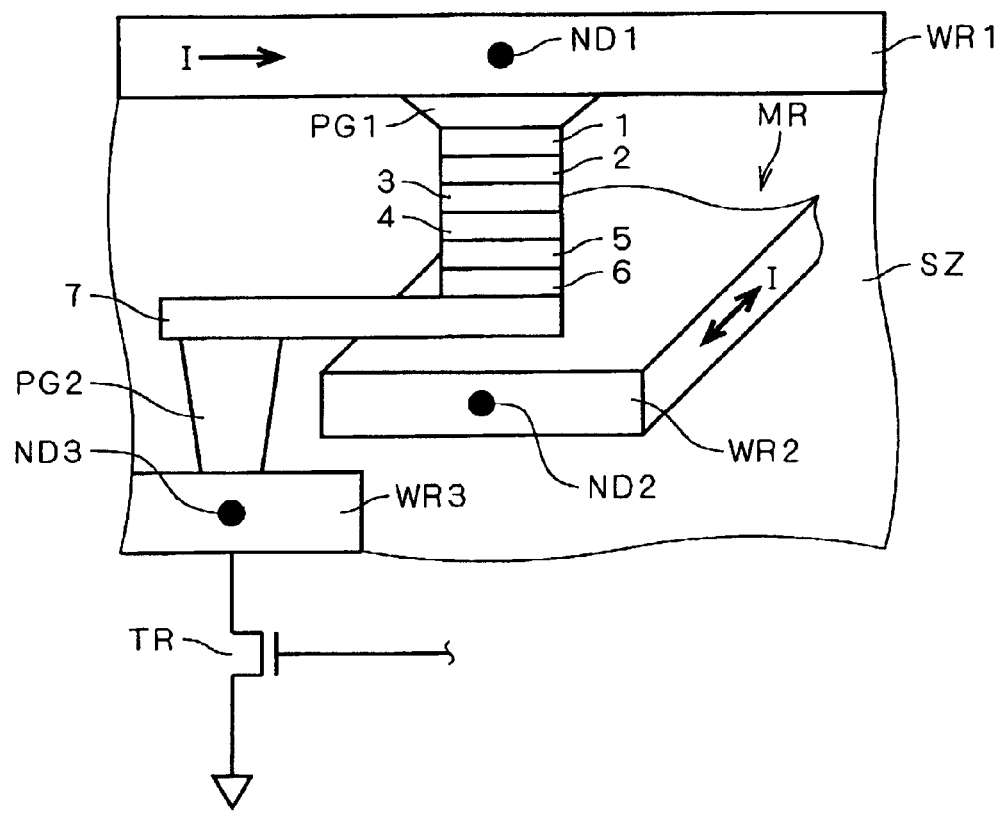
FIG. 1 is a view schematically showing a sectional structure of a general-type magnetic tunnel resistance element.

FIG. 1 schematically shows a sectional structure of a general-type magnetic tunnel resistance element MR.

As shown in FIG. 1, the magnetic tunnel resistance element MR has a structure in which ferromagnetic substances 2 and 1 are layered on an insulator 3 in this order and a ferromagnetic substance 4 is provided below the insulator 3. Such a structure as above, in which the ferromagnetic substances sandwich the insulator, is referred to as a magnetic tunnel junction (MTJ).

Further, an antiferromagnetic substance 5 is provided below the ferromagnetic substance 4. The antiferromagnetic substance 5 serves to fix the direction of magnetization of the ferromagnetic substance 4, and this structure is referred to as a spin valve type magnetic tunnel junction.

Among the ferromagnetic substances 1 and 2, the ferromagnetic substance 1 is made of a material having smaller coercivity and the direction of magnetization of the ferromagnetic substance 1 is thereby more easily inverted. As a result, inversion in direction of magnetization of the ferromagnetic substance 2 occurs following the inversion in direction of magnetization of the ferromagnetic substance 1.

The magnetic tunnel resistance element MR is buried in an interlayer insulating film SZ and an interconnection plug PG1 is provided on the ferromagnetic substance 1, to expose an upper end surface of the interconnection plug PG1 in a main surface of the interlayer insulating film SZ. A wire WR1 is provided on the interlayer insulating film SZ so as to be contact with the upper end surface of the interconnection plug PG1.

Further, a metal layer 6 is provided below the antiferromagnetic substance 5 and connected to a metal layer 7. Below the metal layer 7, a wire WR2 is provided and its extending direction is a direction two-dimensionally orthogonal to the extending direction of the wire WR1.

A wire WR3 is provided below the wire WR2 and the metal layer 7 is electrically connected to the wire WR3 through an interconnection plug PG2 extending in a vertical direction in the interlayer insulating film SZ. The wire WR3 is electrically connected to an N-channel MOS transistor TR.

Further, it is assumed, in FIG. 1, that the connecting node between the wire WR1 and the interconnection plug PG1 is a node ND1, the connecting node between the wire WR2 and the metal layer 7 is a node ND2 and the connecting node between the wire WR3 and the interconnection plug PG2 is a node ND3.

In such a constitution, when a current is carried from the wire WR1 to the wire WR3, currents tunneling through the insulator 3 are different between a case where the magnetization direction of the ferromagnetic substances 1 and 2 and that of the ferromagnetic substance 3 are different and a case where the magnetization directions are equivalent.

Specifically, the resistance becomes low when the magnetization directions are equivalent and the resistance becomes high when the magnetization directions are different, and the magnetic tunnel junction has two magnetic tunnel resistances corresponding to the magnetization directions of the ferromagnetic substances. This is referred to as an magnetic tunnel resistance effect.

The rate of change of the magnetic tunnel resistance ranges from about 30% to about 50%. The value of the magnetic tunnel resistance depends on the physical property, film thickness and the like of the insulator sandwiched between the ferromagnetic substances as well as the magnetization direction of the ferromagnetic substances. Further, if the vertical arrangement order of the layered structure consisting of the ferromagnetic substance 1 to the antiferromagnetic substance 5 is reversed, the same effect can be produced.

In order to change the magnetic tunnel resistance, specifically, it is only necessary to change the magnetization directions of the ferromagnetic substances 1 and 2. This needs that a current is carried in the wire WR2 and a magnetic field generated around should be larger than a critical magnetic field required to change the direction of magnetization. At this time, though the ferromagnetic substance 4 is affected by the same magnetic field, with the presence of the antiferromagnetic substance 5, the magnetic flux emitted from the ferromagnetic substance 4 enters the antiferromagnetic substance 5 and the magnetization direction of the ferromagnetic substance 4 is not changed. Further, though the direction of a current I flowing in the wire WR2 is represented by an arrow as bidirectional in FIG. 1, this indicates that the current may be carried in either direction.

The antiferromagnetic substance 5 is made of, e.g., IrMn containing Ir (iridium) of 20 to 30 atom. %, the ferromagnetic substances 4 and 2 are each made of CoFe having large coercivity, the insulator 3 serving as a tunnel barrier layer is made of $Al_2O_3$ and the ferromagnetic substance 1 is made of $Ni_{80}Fe_{20}$ (permalloy) having small coercivity and spin polarizability.

Figure 2:
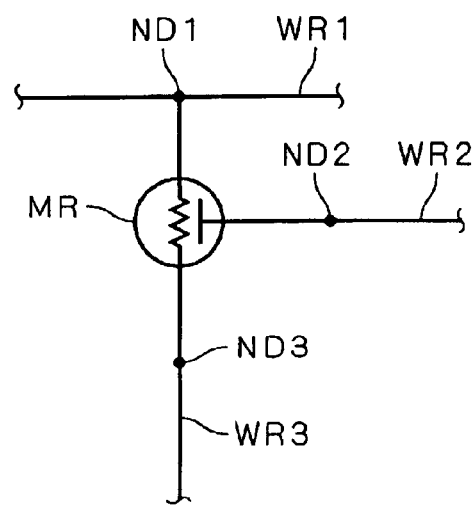
FIG. 2 is a view illustrating sign representations of the magnetic tunnel resistance element.

FIG. 2 shows a symbol representing the magnetic tunnel resistance element MR. MR is an abbreviation of Magnetic Resistivity.

The symbol of FIG. 2 indicates a resistance element in which the resistance between the node ND1 and the node ND3 can be changed by the magnetic field generated by carrying a current in the wire WR2. Accordingly, the symbol of FIG. 2 comprehends all magnetic tunnel resistance elements having this characteristic feature and is not limited to the structure shown in FIG. 1.

Figure 3:
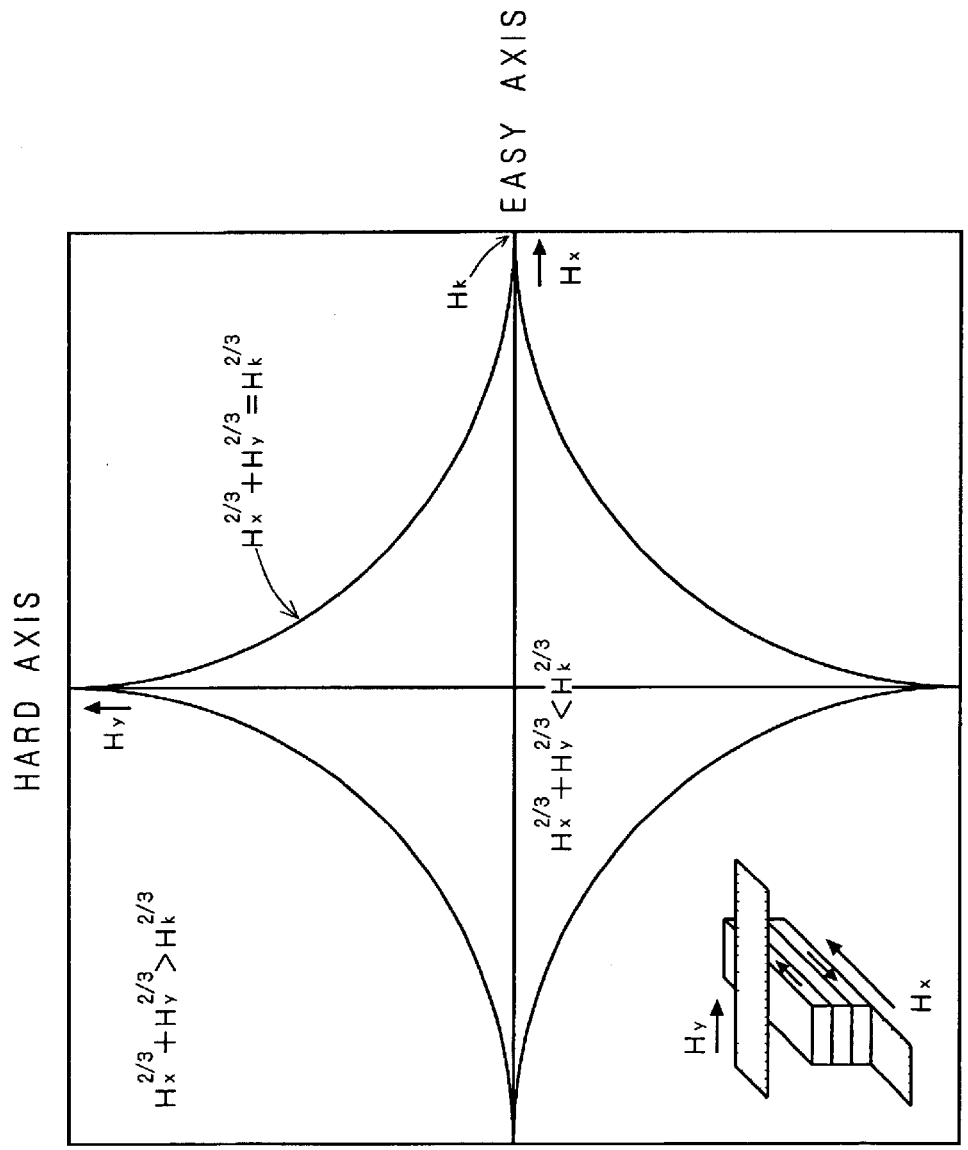
FIG. 3 is a view showing the magnitude and direction of a magnetic field required to change the magnetization direction of a ferromagnetic substance.

FIG. 3 shows the magnitude and direction of a magnetic field required to change the magnetization direction of the ferromagnetic substance. FIG. 3 shows the relation of three magnetic fields Hk, Hx and Hy in a case where the magnetic field (critical magnetic field) Hk required to invert the direction of magnetization is formed in a coupled magnetic field of the magnetic fields Hx and Hy, by a curve referred to as asteroid curve.

Herein, a direction of easy magnetization of the ferromagnetic substance is referred to as easy axis and a direction of hard magnetization is referred to as hard axis. In FIG. 3, the horizontal axis indicates the easy axis and the vertical axis indicates the hard axis, and the factor of magnetic field in the x-axis direction is represented as Hx and the factor of magnetic field in the y-axis direction is represented as Hy.

As shown in FIG. 3. in a range of $H_x^{2/3}+H_y^{2/3}<H_k^{2/3}$, the direction of magnetization is not changed. On the other hand, in a range of $H_x^{2/3}+H_y^{2/3}>H_k^{2/3}$, the direction of magnetization is changed.

Figure 4:
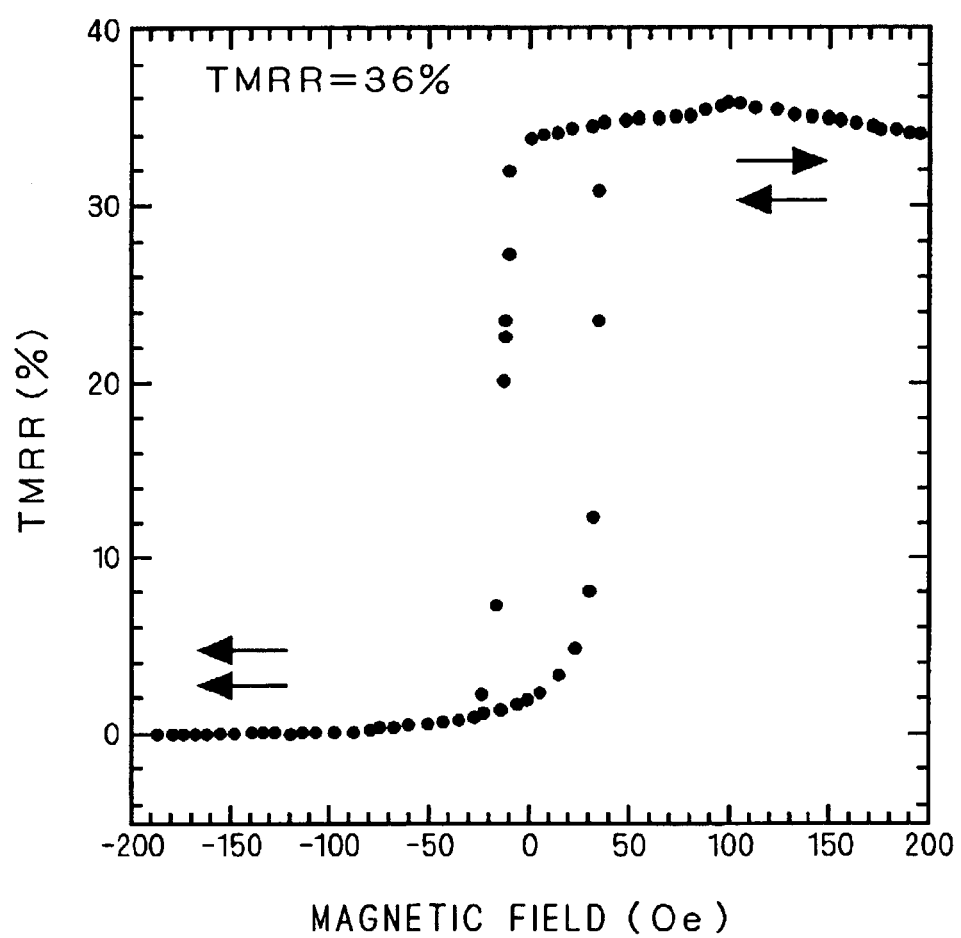
FIG. 4 is a graph showing measured characteristics of a tunnel magnetic resistance in a spin valve type magnetic tunnel junction structure.

FIG. 4 shows measured characteristics of a tunnel magnetic resistance (TMR) in the spin valve type magnetic tunnel junction structure.

In FIG. 4, the horizontal axis indicates a magnetic field (1 oersted=about 79 A/m) and the vertical axis indicates a tunnel magnetic resistance rate (TMRR). From FIG. 4, it is found that the TMRR changes by about 36%, a magnetic field required to invert the direction of magnetization is low, about 30 (×79 A/m), and the hysteresis symmetrical with respect to the direction of magnetization is obtained.

A. The First Preferred Embodiment

As the first preferred embodiment of the present invention, the constitutions and operations of various filters having magnetic tunnel resistance elements will be discussed.

A-1. The First Example of Filter

Figure 5:
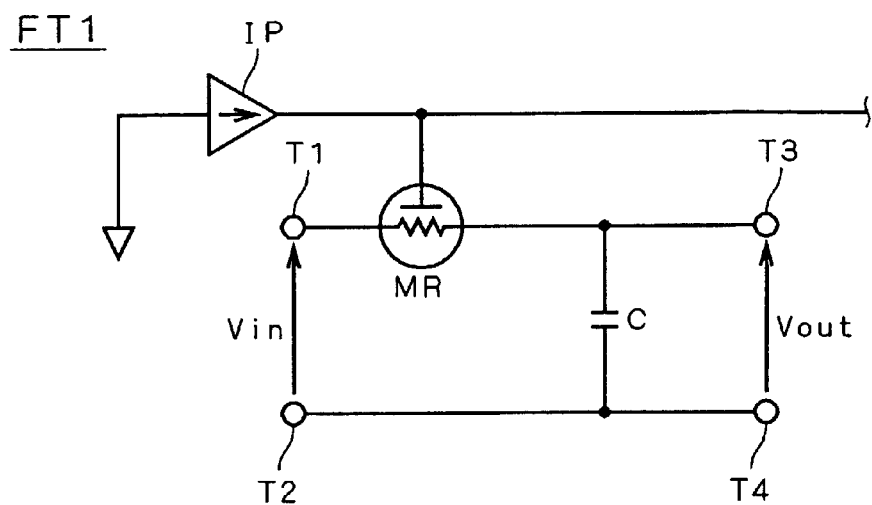
FIG. 5 is a view showing a low-pass filter in accordance with a first preferred embodiment of the present invention.
Figure 6:
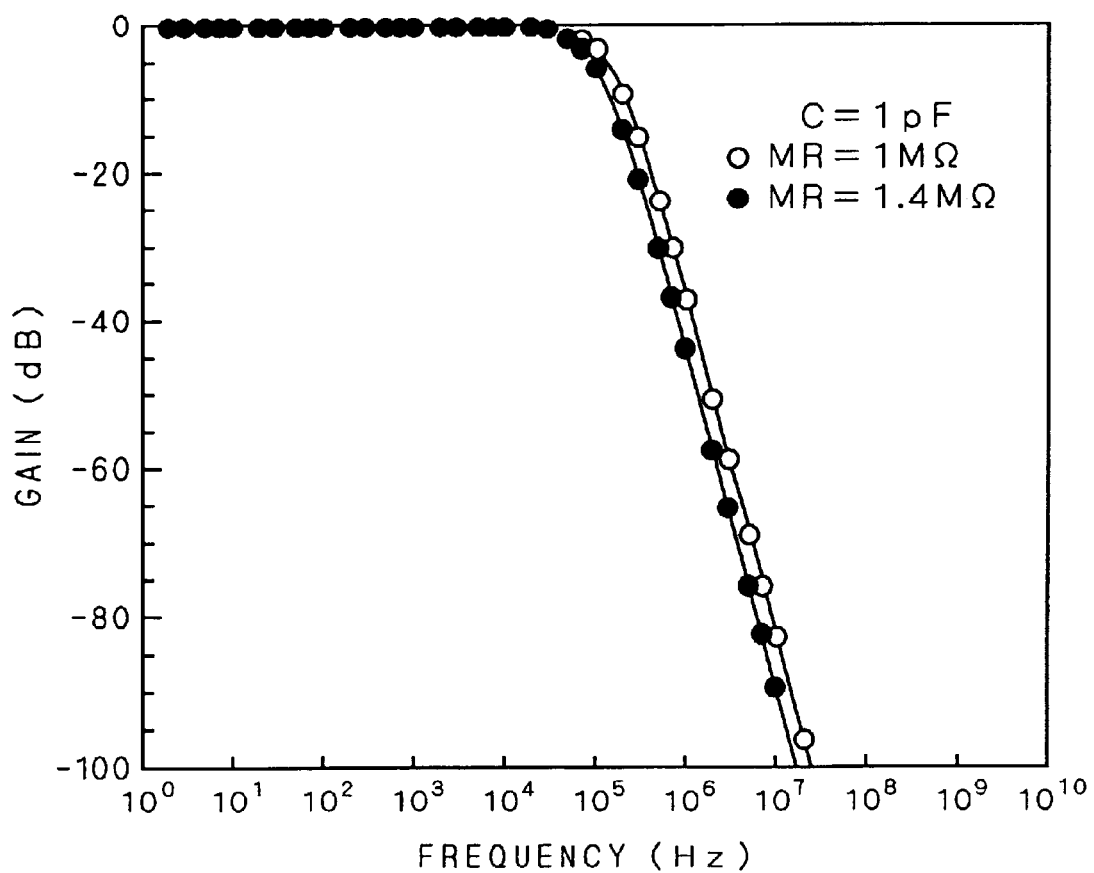
FIG. 6 is a graph showing characteristics of the low-pass filter in accordance with the first preferred embodiment of the present invention.

Referring to FIGS. 5 and 6, the constitution and operation of a filter FT1 will be discussed, as the first example of filter.

As shown in FIG. 5, The filter FT1 is a low-pass filter (hereinafter, referred to as "LPF") in which the magnetic tunnel resistance element MR and the capacitor C are connected to each other in the shape of L. Further, in the filter FT1, the terminals T1 and T2 serve as input terminals and the terminals T3 and T4 serve as output terminals. Furthermore, a current to change the magnetization direction of the magnetic tunnel resistance element MR is supplied through a current source IP.

FIG. 6 shows the frequency characteristics of the filter FT1 with respect to the following two magnetic tunnel resistances, in a case where the magnetic tunnel resistance element MR uses a resistance element whose magnetic tunnel resistance is 1 MΩ when the magnetization directions of two ferromagnetic substances sandwiching the insulator are equivalent and 1.4 MΩ when the magnetization directions are different.

In FIG. 6, the horizontal axis represents the frequency (Hz) and the vertical axis represents the gain (dB), and the frequency characteristic of the case where the magnetic tunnel resistance of the magnetic tunnel resistance element MR is 1 MΩ is represented by blank circles and that of the case where the magnetic tunnel resistance is 1.4 MΩ is represented by solid circles. Further, the static capacitance of the capacitor C is 1 pF.

As shown in FIG. 6, the frequency at the time when the damping factor is −100 dB is about 17 MHZ and about 22 MHz depending on the resistance values. In other words, this indicates that use of the magnetic tunnel resistance element MR allows frequency adjustment of about 5 MHz.

Further, for a fine-tuning, it is only necessary to use combinations of magnetic resistance values with a circuit in which a plurality of magnetic tunnel resistance elements are connected in series, in parallel or in a grid pattern.

A-2. The Second Example of Filter

Figure 7:
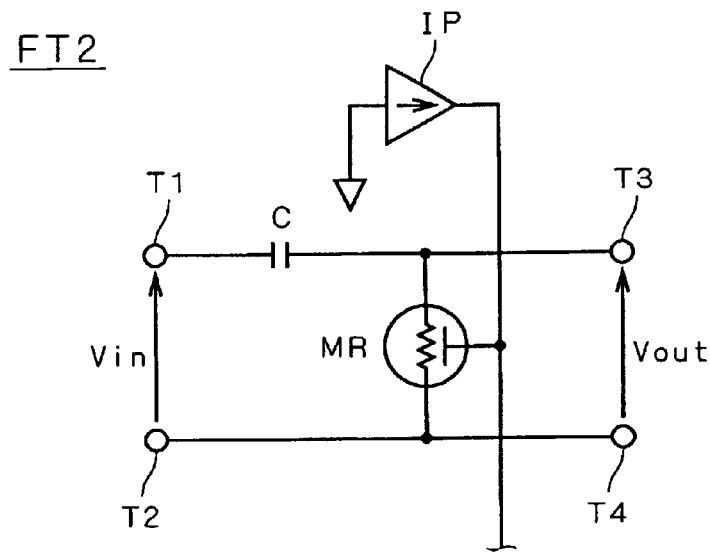
FIG. 7 is a view showing a configuration of a high-pass filter in accordance with the first preferred embodiment of the present invention.
Figure 8:
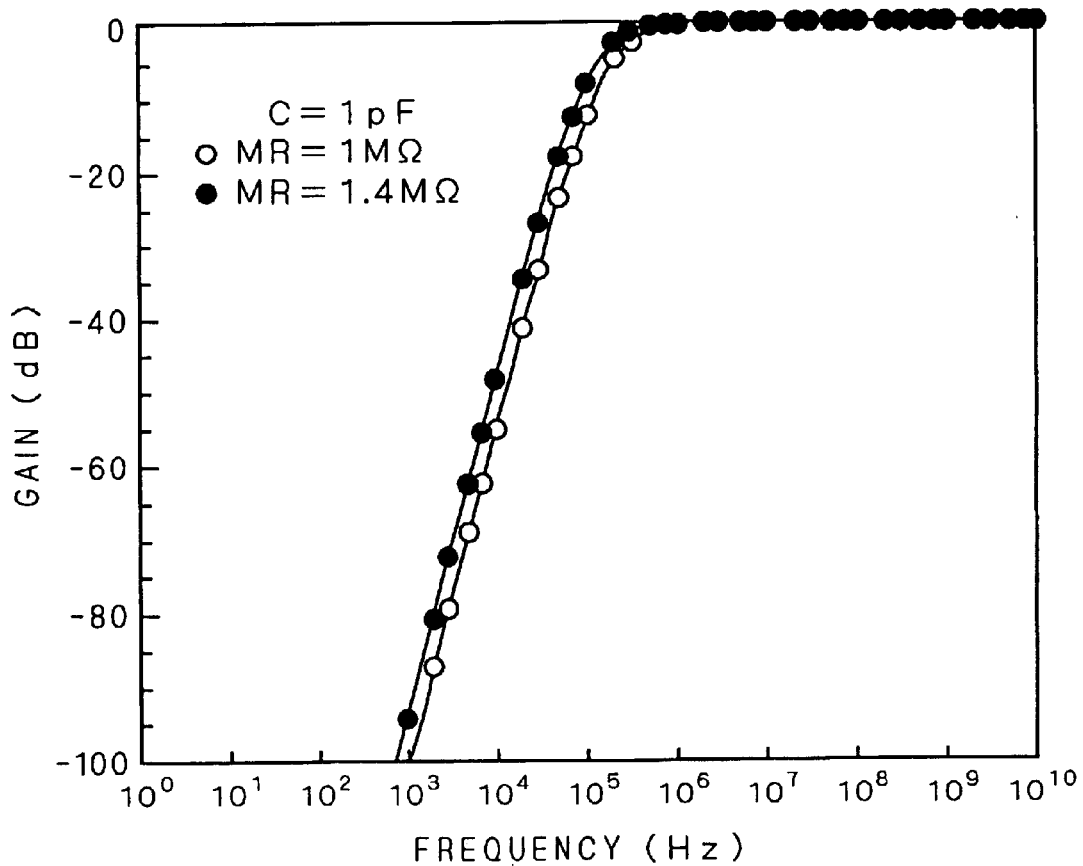
FIG. 8 is a graph showing characteristics of the high-pass filter in accordance with the first preferred embodiment of the present invention.

Referring to FIGS. 7 and 8, the constitution and operation of a filter FT2 will be discussed, as the second example of filter.

As shown in FIG. 7, The filter FT2 is a high-pass filter (hereinafter, referred to as "HPF") in which the magnetic tunnel resistance element MR and the capacitor C are connected to each other in the shape of L. Constituent elements identical to those of the filter FT1 shown in FIG. 5 are represented by the same reference signs and redundant discussion will be omitted.

Herein, the magnetic tunnel resistance of the magnetic tunnel resistance element MR can be changed into 1 MΩ and 1.4 MΩ like the filter FT1 shown in FIG. 5, and FIG. 8 shows the frequency characteristics of the filter FT2 with respect to the two magnetic tunnel resistances.

In FIG. 8, the horizontal axis represents the frequency (Hz) and the vertical axis represents the gain (dB), and the frequency characteristic of the case where the magnetic tunnel resistance of the magnetic tunnel resistance element MR is 1 MΩ is represented by blank circles and that of the case where the magnetic tunnel resistance is 1.4 MΩ is represented by solid circles. Further, the static capacitance of the capacitor C is 1 pF.

As shown in FIG. 8, the frequency at the time when the damping factor is −100 dB is about 1.7 kHZ and about 0.78 kHz depending on the resistance values. In other words, this indicates that use of the magnetic tunnel resistance element MR allows frequency adjustment of about 500 Hz.

A-3. The Third Example of Filter

Figures 9, 10:
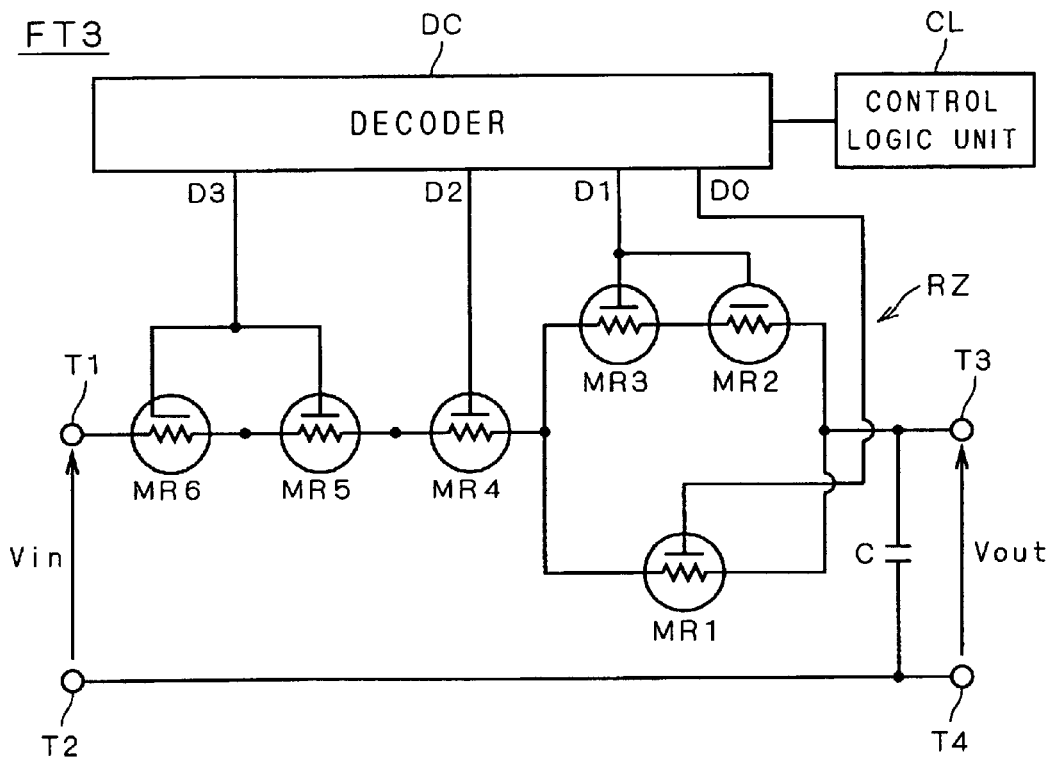
FIG. 9 is a view specifically showing a configuration of a variable resistance of the low-pass filter in accordance with the first preferred embodiment of the present invention.
FIG. 10 is a table showing correspondence between combinations of control signals and resistance values of the corresponding variable resistances.
Figure 11:
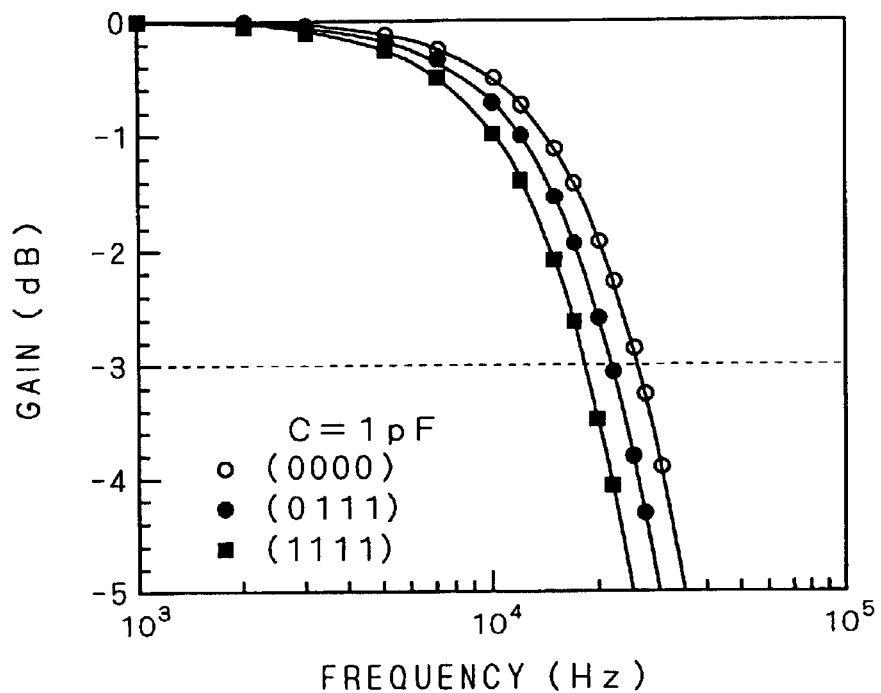
FIG. 11 is a graph showing characteristics of the low-pass filter in accordance with the first preferred embodiment of the present invention.

Referring to FIGS. 9 to 11, the constitution and operation of a filter FT3 will be discussed, as the third example of filter.

As shown in FIG. 9, the filter FT3 is an L-shaped primary LPF, and a resistance unit of the LPF is constituted of a plurality of magnetic tunnel resistance elements, being referred to as a variable resistance RZ. Specifically, the filter FT3 has the variable resistance RZ having a constitution where magnetic tunnel resistance elements MR6, MR5, MR4, MR3 and MR2 are provided, being connected in series, in this order from the side of the terminal T1 between the terminals T1 and T3 and a magnetic tunnel resistance element MR1 is connected in parallel to the magnetic tunnel resistance elements MR2 and MR3, and the capacitor C is interposed between a wire connecting the terminals T2 and T4 and an end portion of the magnetic tunnel resistance element MR2 on the side of the terminal T3.

The resistance values of the magnetic tunnel resistance elements MR1 to MR6 are set by control signals D0, D1, D2 and D3 supplied from a decoder DC. Specifically, the magnetization directions of the magnetic tunnel resistance elements MR1 to MR6 are controlled by the control signals D0 to D3.

The decoder DC, receiving a program signal from a control logic unit CL, decodes the signal to generate the control signals D0 to D3. Further, the decoder DC is also referred to as a control unit for controlling the resistance value of the variable resistance RZ.

Herein, the control signal D3 is given to the magnetic tunnel resistance elements MR5 and MR6, the control signal D2 is given to the magnetic tunnel resistance element MR4, the control signal D1 is given to the magnetic tunnel resistance elements MR2 and MR3, and the control signal D0 is given to the magnetic tunnel resistance element MR1. Further, since the magnetic tunnel resistance elements MR2 and MR3 and the magnetic tunnel resistance elements MR5 and MR6 are controlled in common by the control signals D1 and D3, respectively, each pair is referred to as a magnetic tunnel resistance element series unit, and since the magnetic tunnel resistance elements MR1 and MR4 are controlled independently by the control signals D0 and D2, respectively, each element is referred to as an independent magnetic tunnel resistance element.

FIG. 10 is a table showing correspondence between combinations of the control signals D0 to D3 and over-all resistance value of the corresponding magnetic tunnel resistance elements MR1 to MR6.

Herein, the resistance values of the magnetic tunnel resistance elements MR1 to MR6 can be each selected out of two kinds of resistance values, i.e., low resistance RL and high resistance RH.

As shown in FIG. 10, when the control signals D0 to D3 are all 0, for example, a current to set the magnetization direction of the ferromagnetic substance flows so that the resistance values of the magnetic tunnel resistance elements MR1 to MR6 should be all set to the low resistance RL, and when the control signals D0 to D3 are all 1, for example, the current to set the magnetization direction of the ferromagnetic substance flows so that the resistance values of the magnetic tunnel resistance elements MR1 to MR6 should be all set to the high resistance RH.

FIG. 11 shows the frequency characteristics of the filter FT3 in three cases where the control signals (D3, D2, D1, D0)=(0, 0, 0, 0), (0, 1, 1, 1), (1, 1, 1, 1). In FIG. 11, the horizontal axis represents the frequency (Hz) and the vertical axis represents the gain (dB), and the frequency characteristics of the filter FT3 in the three cases where the control signals (D3, D2, D1, D0)=(0, 0, 0, 0), (0, 1, 1, 1), (1, 1, 1, 1) are represented by blank circles, solid circles and solid squares, respectively. Further, the low resistance RL is 1 MΩ, the high resistance RH is 1.4 MΩ and the static capacitance of the capacitor C is 1 pF.

In FIG. 11, the frequency at the time when the damping factor is −3 dB is about 27 kHZ, about 23 kHZ and about 19 MHz in the cases where the combinations of the control signals D3, D2, D1 and D0 are (0, 0, 0, 0), (0, 1, 1, 1) and (1, 1, 1, 1), respectively. This indicates that sixteen combinations of the control signals D3, D2, D1 and D0 allow sixteen kinds of settings of frequency characteristics.

Further, though FIG. 9 shows the exemplary configuration including both a structure in which the magnetic tunnel resistance element series units and the independent magnetic tunnel resistance elements are connected in series and a structure in which the magnetic tunnel resistance element series units and the independent magnetic tunnel resistance elements are connected in parallel, the variable resistance may be formed of either structure and may be formed of only one magnetic tunnel resistance element.

A-4. The Fourth Example of Filter

Figure 12:
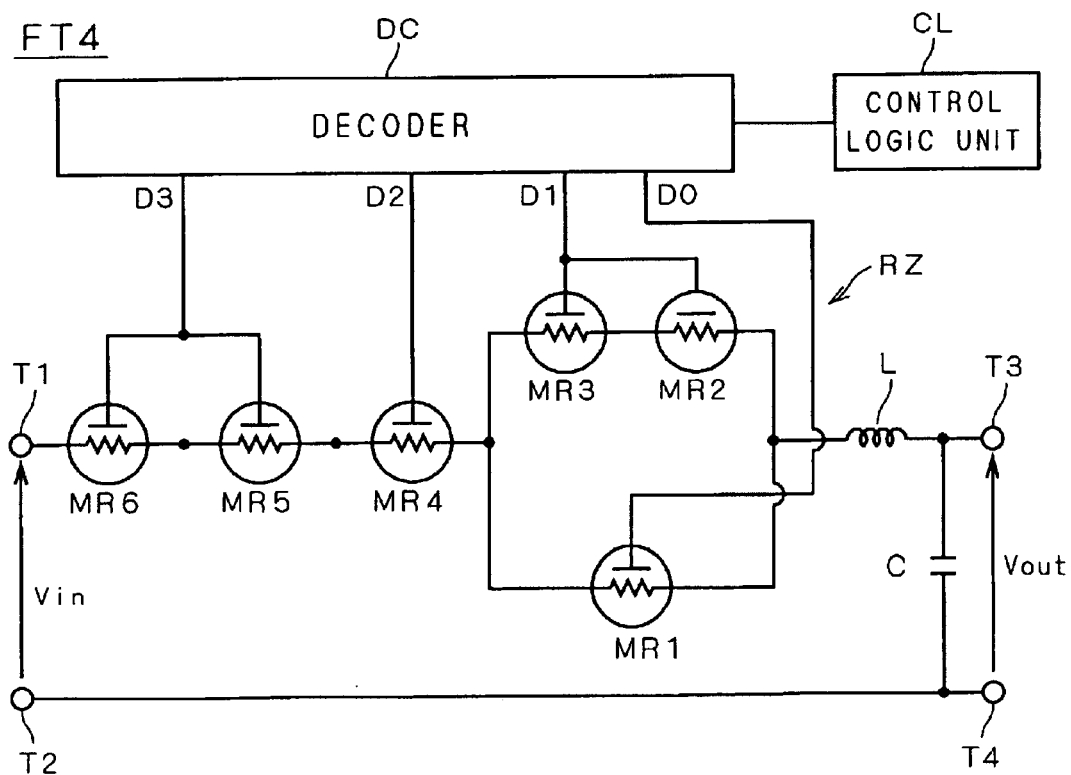
FIG. 12 is a view showing a configuration of an L-shaped secondary low-pass filter in accordance with the first preferred embodiment of the present invention.

Referring to FIGS. 12 to 14, the constitution and operation of a filter FT4 will be discussed, as the fourth example of filter.

As shown in FIG. 12, the filter FT4 is an L-shaped secondary LPF in which the variable resistance RZ and the inductor L are connected in series between the terminals T1 and T3, and the capacitor C is interposed between the wire connecting the terminals T2 and T4 and an end portion of the inductor L on the side of the terminal T3.

The variable resistance RZ of the filter FT4 is constituted of the magnetic tunnel resistance elements MR1 to MR6 like the filter FT3 discussed with reference to FIG. 9. Further, the resistance values of the magnetic tunnel resistance elements MR1 to MR6 are set by the control signals D0, D1, D2 and D3 supplied from the decoder DC, also like in the filter FT3.

FIG. 13 shows the frequency characteristics of the filter FT4 in four cases where the control signals (D3, D2, D1, D0)=(0, 0, 0, 0), (0, 0, 1, 1), (0, 1, 1, 1), (1, 1, 1, 1).

In FIG. 13, the horizontal axis represents the frequency (Hz) and the vertical axis represents the gain (dB), and the frequency characteristics of the filter FT4 in the four cases where the control signals (D3, D2, D1, D0)=(0, 0, 0, 0), (0, 0, 1, 1), (0, 1, 1, 1), (1, 1, 1, 1) are represented by blank circles, solid circles, blank squares and blank triangles, respectively. Further, the magnetic tunnel resistance values of the magnetic tunnel resistance elements MR1 to MR6 can be each selected out of two kinds of resistance values, i.e., 8.0 kΩ and 11.2 kΩ, and the static capacitance of the capacitor C is 6.25 pF and the inductance is 4.05 mH.

As shown in FIG. 13, it is found that the resonance occurs and the characteristic curve is distorted near the frequency of 1×10$^6$ Hz.

FIG. 14 is a table showing the Q-values in the four cases where the control signals (D3, D2, D1, D0)=(0, 0, 0, 0), (0, 0, 1, 1), (0, 1, 1, 1), (1, 1, 1, 1).

As shown in FIG. 14, combinations of the control signals D3 to D0 allow adjustment of the Q-value of the filter FT4. For example, in order to set the Q-value to 0.734, it is necessary to set the program signal of the control logic unit CL so that the relation should hold, (D3, D2, D1, D0)=(0, 1, 1, 1). Thus, it is possible to correct the variations in value of the inductor L and the capacitor C caused by the manufacturing process with the magnetic tunnel resistance values and achieve characteristics with the Q-value of 0.8 or lower without distortion in frequency characteristic curve.

A-5. The Fifth Example of Filter

Figure 15:
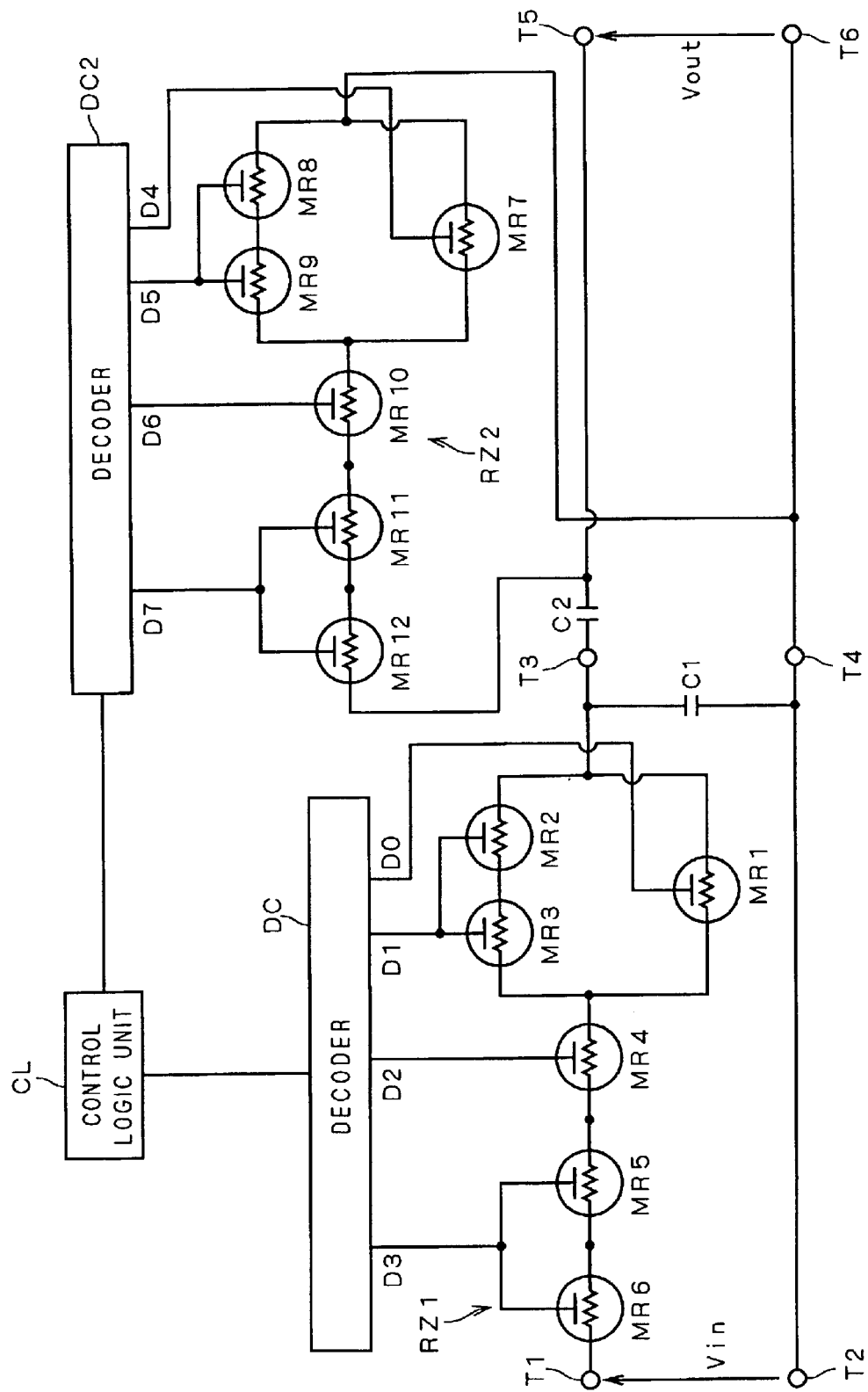
FIG. 15 is a view showing a configuration of a band-pass filter in accordance with the first preferred embodiment of the present invention.
Figure 16:
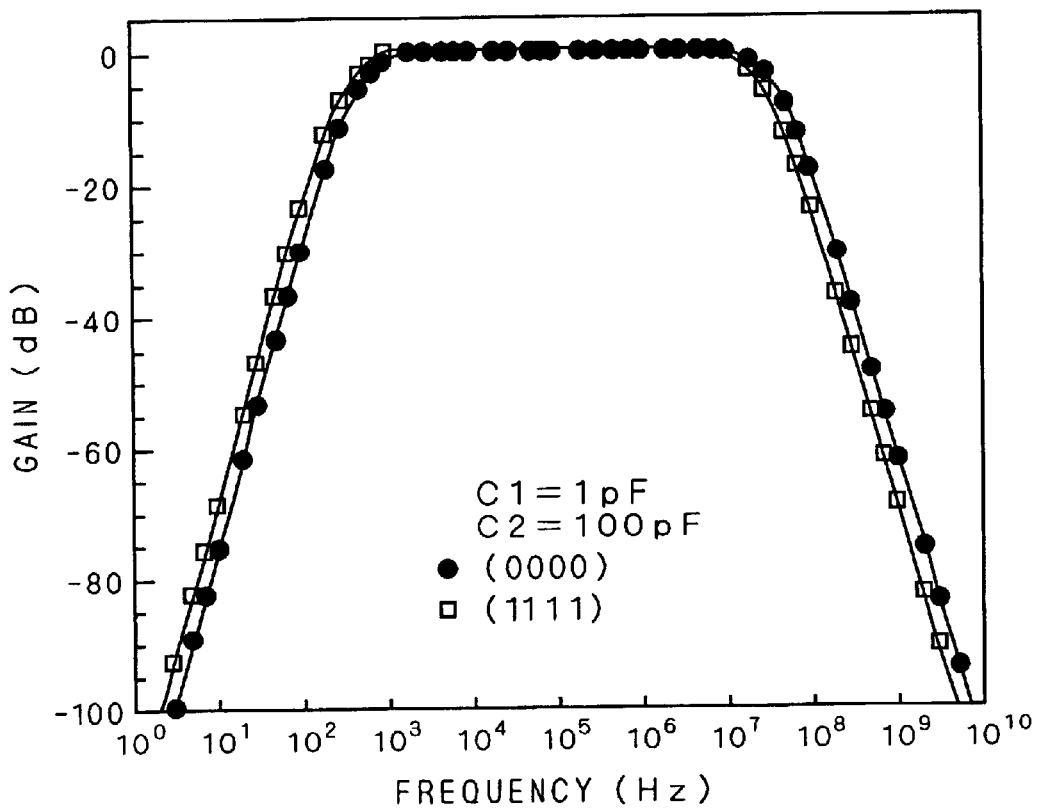
FIG. 16 is a graph showing characteristics of the band-pass filter in accordance with the first preferred embodiment of the present invention.

Referring to FIGS. 15 and 16, the constitution and operation of a filter FT5 will be discussed, as the fifth example of filter.

As shown in FIG. 15, in the filter FT5, a resistor RZ1 is interposed between the terminals T1 and T3, and the capacitor C is interposed between the wire connecting the terminals T2 and T4 and an end portion of the resistor RZ1 on the side of the terminal T3. Further, a capacitor C2 is interposed between the terminals T3 and T5, and a resistor RZ2 is interposed between a wire connecting the terminals T4 and T6 and an electrode of the capacitor C2 on the side of the terminal T5, to form a band-pass filter (hereinafter, referred to as "BPF").

The resistor RZ1 of the filter FT5 is constituted of the magnetic tunnel resistance elements MR1 to MR6 like the resistor RZ of the filter FT3 discussed with reference to FIG. 9. Further, the resistance values of the magnetic tunnel resistance elements MR1 to MR6 are set by the control signals D0, D1, D2 and D3 supplied from the decoder DC, also like in the resistor RZ of the filter FT3.

The resistance values of the magnetic tunnel resistance elements MR1 to MR6 are set by the control signals D0, D1, D2 and D3 supplied from a decoder DC1. The decoder DC1, receiving the program signal from the control logic unit CL, decodes the signal to generate the control signals D0 to D3. Herein, the control signal D3 is given to the magnetic tunnel resistance elements MR5 and MR6, the control signal D2 is given to the magnetic tunnel resistance element MR4, the control signal D1 is given to the magnetic tunnel resistance elements MR2 and MR3, and the control signal D0 is given to the magnetic tunnel resistance element MR1.

Further, the resistor RZ2 has magnetic tunnel resistance elements MR8, MR9, MR10, MR11 and MR12 connected in series to one another and a magnetic tunnel resistance element MR7 connected to in parallel to the magnetic tunnel resistance elements MR8 and MR9.

The resistance values of the magnetic tunnel resistance elements MR7 to MR12 are set by control signals D4, D5, D6 and D7 supplied from a decoder DC2. The decoder DC2, receiving the program signal from the control logic unit CL, decodes the signal to generate the control signals D4 to D7. Herein, the control signal D7 is given to the magnetic tunnel resistance elements MR11 and MR12, the control signal D6 is given to the magnetic tunnel resistance element MR10, the control signal D5 is given to the magnetic tunnel resistance elements MR8 and MR9, and the control signal D4 is given to the magnetic tunnel resistance element MR7.

FIG. 16 shows the frequency characteristics of the filter FT5 in two cases where the control signals (D3, D2, D1, D0)=the control signals (D7, D6, D5, D4)=(0, 0, 0, 0) and (1, 1, 1, 1).

In FIG. 16, the horizontal axis represents the frequency (Hz) and the vertical axis represents the gain (dB), and the frequency characteristics of the filter FT5 in the two cases where (D3, D2, D1, D0)=(D7, D6, D5, D4)=(0, 0, 0, 0) and (1, 1, 1, 1) are represented by solid circles and blank squares, respectively.

Further, the magnetic tunnel resistance values of the magnetic tunnel resistance elements MR1 to MR6 can be each selected out of two kinds of resistance values, i.e., 1 k$\Omega$ and 1.4 k$\Omega$, the magnetic tunnel resistance values of the magnetic tunnel resistance elements MR7 to MR12 can be each selected out of two kinds of resistance values, i.e., 1 M$\Omega$ and 1.4 M$\Omega$, and the static capacitance of the capacitor C1 is 1 pF and the static capacitance of the capacitor C2 is 100 pF.

As shown in FIG. 16, the filter FT5 allows fine-tuning of the band-pass frequency region by changing the values of the resistors RZ1 and RZ2 each constituted of magnetic tunnel resistance elements.

A-6. Action and Effect

As discussed above with reference to the first to fifth examples of filters, since the filter constituted of the magnetic tunnel resistance elements allows arbitrary settings of magnetic tunnel resistance values by using a plurality of combined magnetic tunnel resistance elements and changing (programming) combinations of the control signals for the respective resistance elements, it is possible to correct manufacturing variations of elements with the magnetic tunnel resistance values and achieve a filter having a desired frequency characteristic.

B. The Second Preferred Embodiment

As the second preferred embodiment of the present invention, the constitution and operation of an amplifier having the magnetic tunnel resistance elements will be discussed.

B-1. Constitution and Operation

Referring to FIGS. 17 to 20, the constitution and operation of an amplifier AP1 will be discussed.

Figure 17:
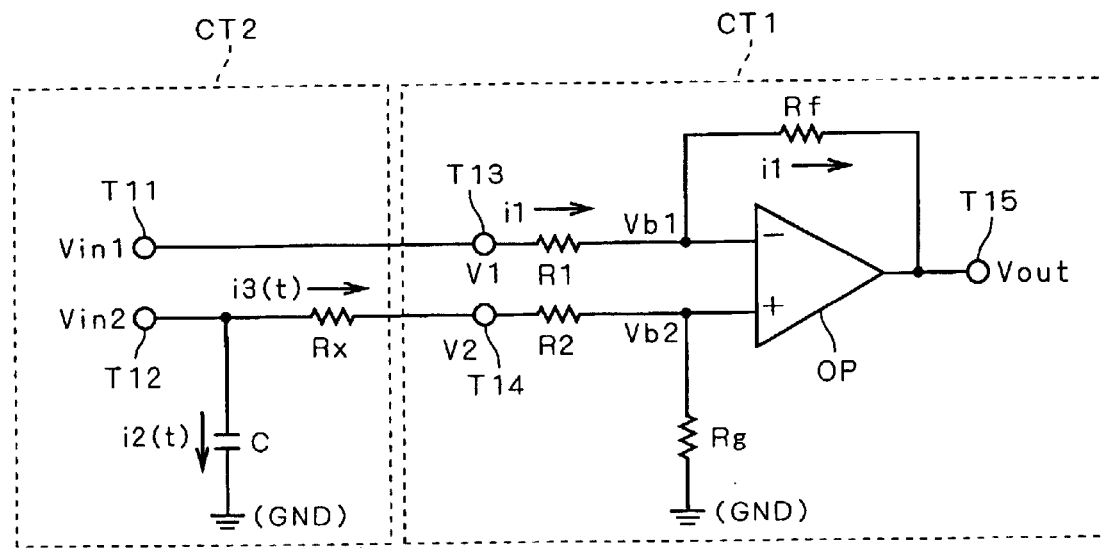
FIG. 17 is a view showing a configuration of an amplifier in accordance with a second preferred embodiment of the present invention.

As shown in FIG. 17, the amplifier AP1 is constituted of two circuits, i.e., a subtractor circuit CT1 and its ante-stage circuit CT2. First, discussion will be made on the subtractor circuit CT1.

Assuming that terminals of the subtractor circuit CT1 to which an input voltage V1 and an input voltage V2 are terminals T13 and T14, the resistor R1 is interposed between the terminal T13 and an inverting input terminal of an op-amp (operational amplifier) OP, the resistor R2 is interposed between the terminal T14 and a noninverting input terminal of the op-amp OP, and an output terminal of the operational amplifier OP is connected to a terminal T15.

Further, the inverting input terminal and the output terminal of the operational amplifier OP are electrically connected to each other through a resistor Rf, and the noninverting input terminal of the operational amplifier OP is connected to the ground potential through a resistor Rg. Herein, it is assumed that a current flowing in the resistors R1 and Rf is i1, input voltages of the inverting input terminal and the noninverting input terminal of the operational amplifier OP are Vb1 and Vb2, respectively, and an output voltage of the subtractor circuit CT1 is Vout.

In the subtractor circuit CT1 having such a constitution, it is assumed that an open loop gain of the operational amplifier OP is infinite and there is a state of virtual ground where the difference between the two inputs of the operational amplifier OP gets closer to 0 without limit. Therefore, assuming that the relation of the input voltages of the operational amplifier OP is Vb1=Vb2, from the Kirchhoff law, the following equations (13), (14) and (15) are obtained:

$$Vb2 = \frac{Rg}{Rg + R2} \tag{13}$$

$$i1 = \frac{V1 - Vb1}{R1} \tag{14}$$

$$Vout = Vb1 - Rf \times i1 \tag{15}$$

From Eqs. (13), (14) and (15), the output voltage Vout of the subtractor circuit CT1 is obtained by the following equation (16):

$$V\text{out} = \frac{Rf}{R1} \times \frac{Rf + R1}{Rf} \times \frac{Rg}{Rg + R2} V2 - \frac{Rf}{R1} V1 \quad (16)$$

Further, the relation between the resistances R1 and R2 and the relation between the resistances Rf and Rg are assumed as expressed by the following equations (17) and (18):

$$R1=R2 \quad (17)$$

$$Rf=Rg \quad (18)$$

From Eqs. (16) to (18), the output voltage Vout of the subtractor circuit CT1 is expressed by the following equation (19):

$$V\text{out} = \frac{Rf}{R1}(V2 - V1) \quad (19)$$

From Eq. (19), it is found that the difference between the input voltages of the subtractor circuit CT1 is amplified to obtain the output voltage Vout.

Next, the ante-stage circuit CT2 will be discussed. The ante-stage circuit CT2 has terminals T11 and T12, and the terminal T11 is directly connected to the terminal T13 of the subtractor circuit CT1 and the terminal T12 is connected to the terminal T14 of the subtractor circuit CT1 through a resistor Rx, as shown in FIG. 17. Further, the terminal T12 is connected to the ground potential through the capacitor C1.

Assuming herein that the input voltages supplied to the terminals T11 and T12 are Vin1 and Vin2, respectively, a current flowing in the capacitor C1 is i2(t) and a current flowing across the resistor Rx is i3(t), the voltage V1 of the terminal T13 and the input voltage Vin1 are equivalent to each other and the input voltage Vin2 and the voltage V2 of the terminal V14 are expressed by the following equations (20) and (21):

$$\text{Vin2}(t)=\text{Vin2 } \exp(j\omega t) \quad (20)$$

$$V2(t)=V2 \exp[j(\omega t + \phi)] \quad (21)$$

Further, the current i2(t) is expressed by the following equation (22):

$$i2(t) = C\frac{d V\text{in2}(t)}{dt} = j\omega C V\text{in2} \exp(j\omega t) \quad (22)$$

Then, the relation between the input voltage Vin2 and the voltage V2 of the terminal T14 is expressed by the following equation (23):

$$\text{Vin2}(t)-V2(t)=Rx i3(t) \quad (23)$$

Further, the relation between the currents i2(t) and i3(t) is expressed by the following equation (24):

$$i2(t)+i3(t)=0 \quad (24)$$

From Eqs. (21), (22) and (23), the following equation (25) is obtained:

$$j\omega C V\text{in2} \exp(j\omega t) + \frac{V\text{in2}\exp(j\omega t) - V2\exp[j(\omega t + \phi)]}{Rx} \quad (25)$$

Then, from Eq. (25), a gain H(jω) is expressed by the following equation (26):

$$H(j\omega) = \frac{V2(t)}{V\text{in2}(t)} = 1 + j\omega CRx \quad (26)$$

By substituting Eq. (26) into Eq. (19), the following equation (27) is obtained:

$$v\text{out} = \frac{Rf}{R1}[(1 + j\omega CRx)V\text{in2} - V\text{in1}] \quad (27)$$

Assuming herein that Vin1=Vin2=Vin, the gain H(jω) of the amplifier AP1 is expressed by the following equation (28):

$$H(j\omega) = \frac{V\text{out}(t)}{V\text{in}(t)} = \frac{Rf}{R1} j\omega CRx \quad (28)$$

From Eq. (28), it is found that the amplifier AP1 shown in FIG. 17 operates as an amplifier having a gain of RfCRx/R1, and the gain does not depend on the gain of the operational amplifier OP but on the resistance values of the resistors Rf, R1 and Rx and the static capacitance value of the capacitor C1.

In the amplifier AP1 discussed above, though the frequency characteristic is sometimes out of a design value since there is actually a mismatch of the resistance values of the resistors R1 and R2, it is possible to fine-tune the frequency characteristic, for example, by using the magnetic tunnel resistance elements to constitute the resistor Rx.

Figure 18:
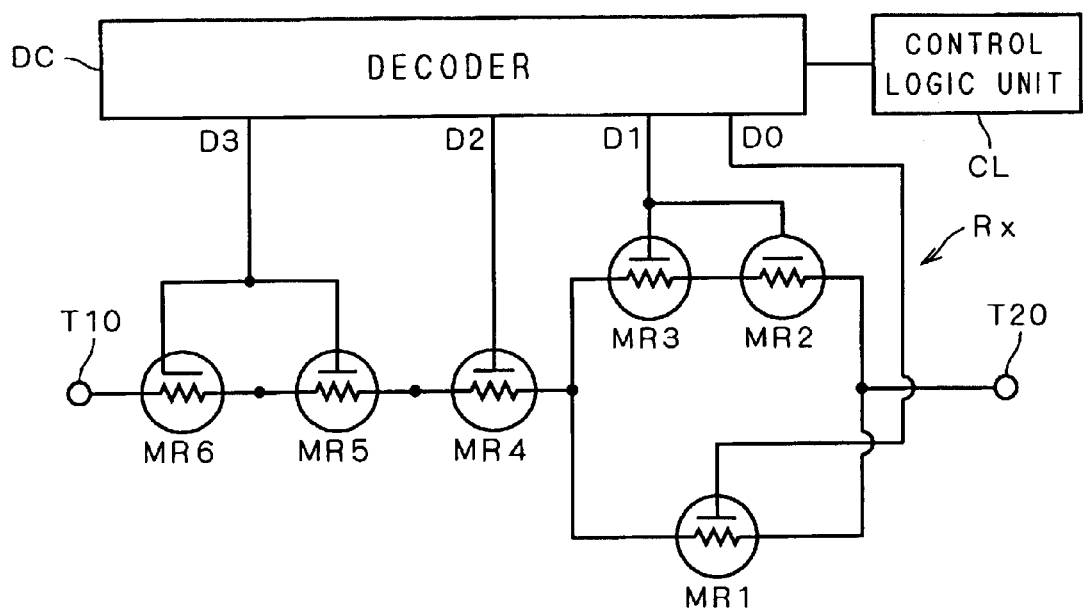
FIG. 18 is a view specifically showing a configuration of a variable resistance of the amplifier in accordance with the second preferred embodiment of the present invention.

FIG. 18 shows a case where the resistor Rx is constituted of a plurality of magnetic tunnel resistance elements. As shown in FIG. 18, the resistor Rx has a constitution where the magnetic tunnel resistance elements MR6, MR5, MR4, MR3 and MR2 are provided, being connected in series, in this order from the side of the terminal T10 between the terminals T10 and T20 and the magnetic tunnel resistance element MR1 is connected in parallel to the magnetic tunnel resistance elements MR2 and MR3.

The resistance values of the magnetic tunnel resistance elements MR1 to MR6 are set by the control signals D0, D1, D2 and D3 supplied from the decoder DC. Specifically, the magnetization direction of the magnetic tunnel resistance elements MR1 to MR6 are controlled by the control signals D0 to D3.

The decoder DC, receiving the program signal from the control logic unit CL, decodes the signal to generate the control signals D0 to D3.

Herein, the control signal D3 is given to the magnetic tunnel resistance elements MR5 and MR6, the control signal D2 is given to the magnetic tunnel resistance element MR4, the control signal D1 is given to the magnetic tunnel resistance elements MR2 and MR3, and the control signal D0 is given to the magnetic tunnel resistance element MR1.

Further, the resistor Rx has the same constitution as the resistor Rz discussed with reference to FIG. 9, and sixteen kinds of resistance values can be obtained by combinations of the control signals D0 to D3, as discussed with reference to FIG. 10.

Figure 19:
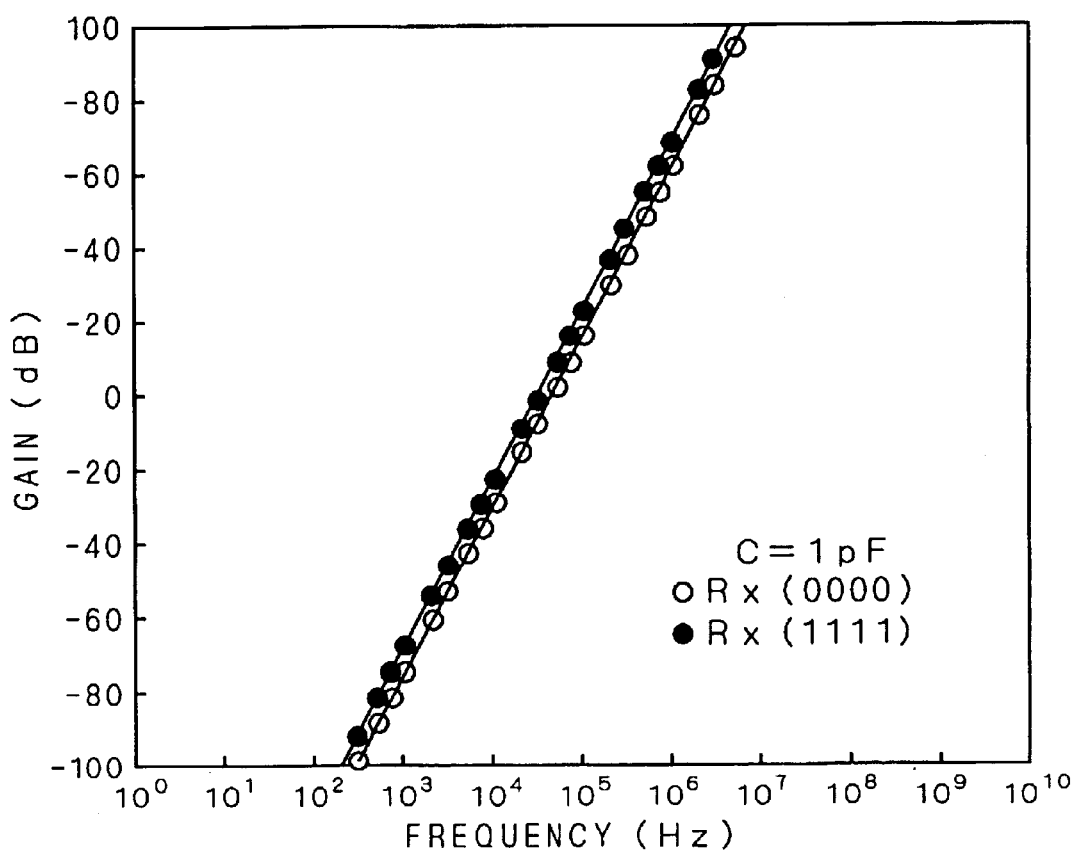
FIGS. 19 and 20 are graphs each showing characteristics of the amplifier in accordance with the second preferred embodiment of the present invention.

FIG. 19 shows the frequency characteristics of the amplifier AP1 in two cases where the control signals (D3, D2, D1, D0)=(0, 0, 0, 0), (1, 1, 1, 1).

In FIG. 19, the horizontal axis represents the frequency (Hz) and the vertical axis represents the gain (dB), and the frequency characteristics of the amplifier AP1 in the two cases where the control signals (D3, D2, D1, D0)=(0, 0, 0, 0), (1, 1, 1, 1) are represented by blank circles and solid circles, respectively. Further, the resistance RL is 1 MΩ, the resistance RH is 1.4 MΩ and the static capacitance of the capacitor C is 1 pF.

Figure 20:
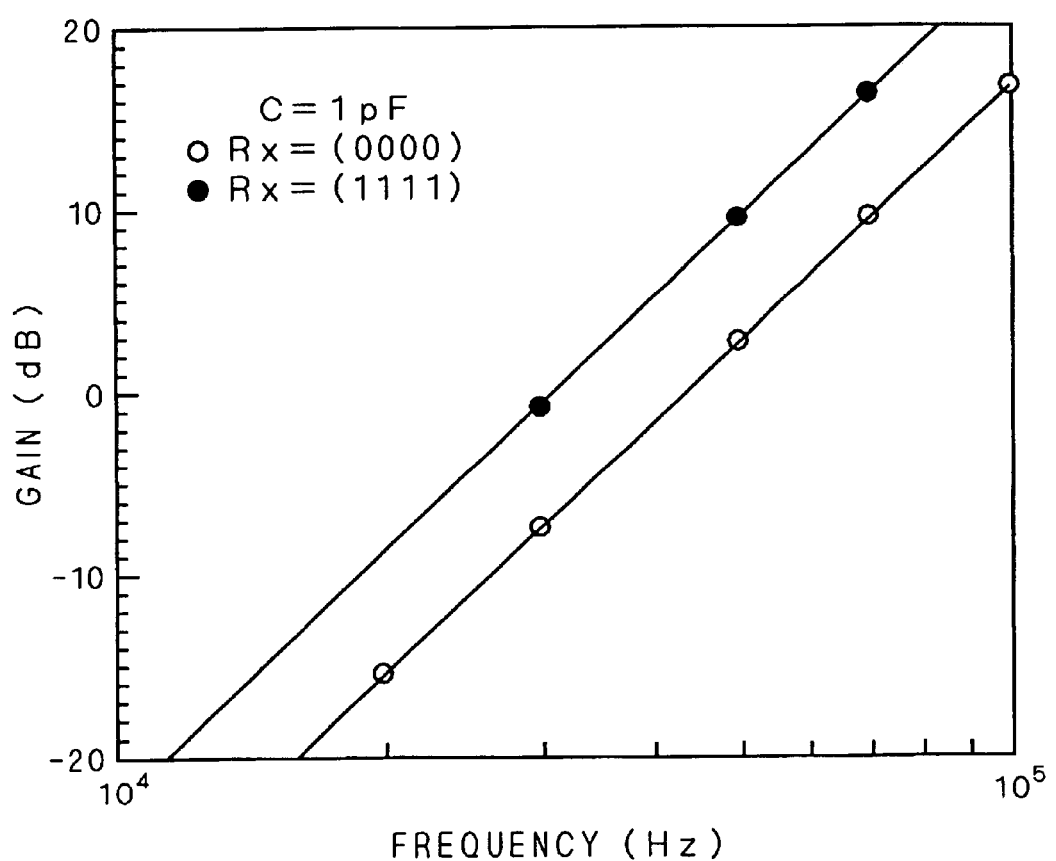

FIG. 20 is a fragmentary detail view of FIG. 19 and FIG. 19 clearly indicates that the frequency characteristic can be fine-tuned by the values of the control signals D3 to D0.

B-2. Action and Effect

As discussed above, in the amplifier, since the magnetic tunnel resistance value can be arbitrarily set by using a plurality of magnetic tunnel resistance elements in combinations and changing (programming) combinations of the control signals for the respective resistance elements, it is possible to correct manufacturing variations of elements with the magnetic tunnel resistance values and achieve an amplifier having a desired frequency characteristic.

B-3. Complement

Complementary discussion will be made on the amplifier AP1 shown in FIG. 17.

When the change of voltage in a circuit is transferred from a point A to a point B, these points are connected with a wire. The voltages of these points are measured with common reference points, i.e., ground points as reference. If the distance between these points is short, the potentials of both ground points may be regarded as equal.

If there is a potential difference between these reference points, however, a noise equivalent to the potential difference is superimposed on a signal. Even if these points are considerably close to each other and connected with a metal wire such as copper and aluminum, when a large current flows through ground, a voltage drop due to the resistance of the copper wire is appreciable, or when a current rapidly changes, a voltage is generated by the inductance of the copper wire to make a noise in some cases. When a magnetic flux going through a loop formed of the ground and the signal line changes, a noise proportional to the change of the magnetic flux is made. In the case where the point A and the point B are far away from each other, particularly, the quality of signal transmission is remarkably deteriorated with this noise.

In order to avoid this problem, the signal is transmitted through two wires on the side of the noninverting input terminal (+ side) and on the side of the inverting input terminal (- side), as shown in FIG. 17.

Further, a circuit on the sending side (the ante-stage circuit C2 of FIG. 17) and a circuit on the receiving side (the subtractor circuit C1 of FIG. 17) have ground points (GND). In this case, if the same noise (common mode noise) is given to the lines on the + side and the - side for the above reason, it is possible to reject the noise by taking the difference of signals on the receiving side. Such a transmission system is referred to as a balanced transmission. It is preferable, in the balanced transmission, that the noises should appear equally on these lines and the two wires should be twisted together if possible.

C. The Third Preferred Embodiment

The above-discussed first and second preferred embodiments of the present invention show the constitutions of the filter and the amplifier to arbitrarily change the magnetic tunnel resistance values by using a plurality of magnetic tunnel resistance elements in combinations and changing (programming) combinations of the control signals for the respective resistance elements and correct the manufacturing variations of elements with the magnetic tunnel resistance values.

In an actual semiconductor integrated circuit, however, when the filter or the amplifier is integrated therein, providing the decoder and the control logic unit dedicated to control the magnetic tunnel resistance leads to upsizing of the semiconductor integrated circuit.

As the third preferred embodiment of the present invention, a constitution to control the resistance value of the magnetic tunnel resistance element will be discussed, referring to FIG. 21.

C-1. Device Constitution

Figure 21:
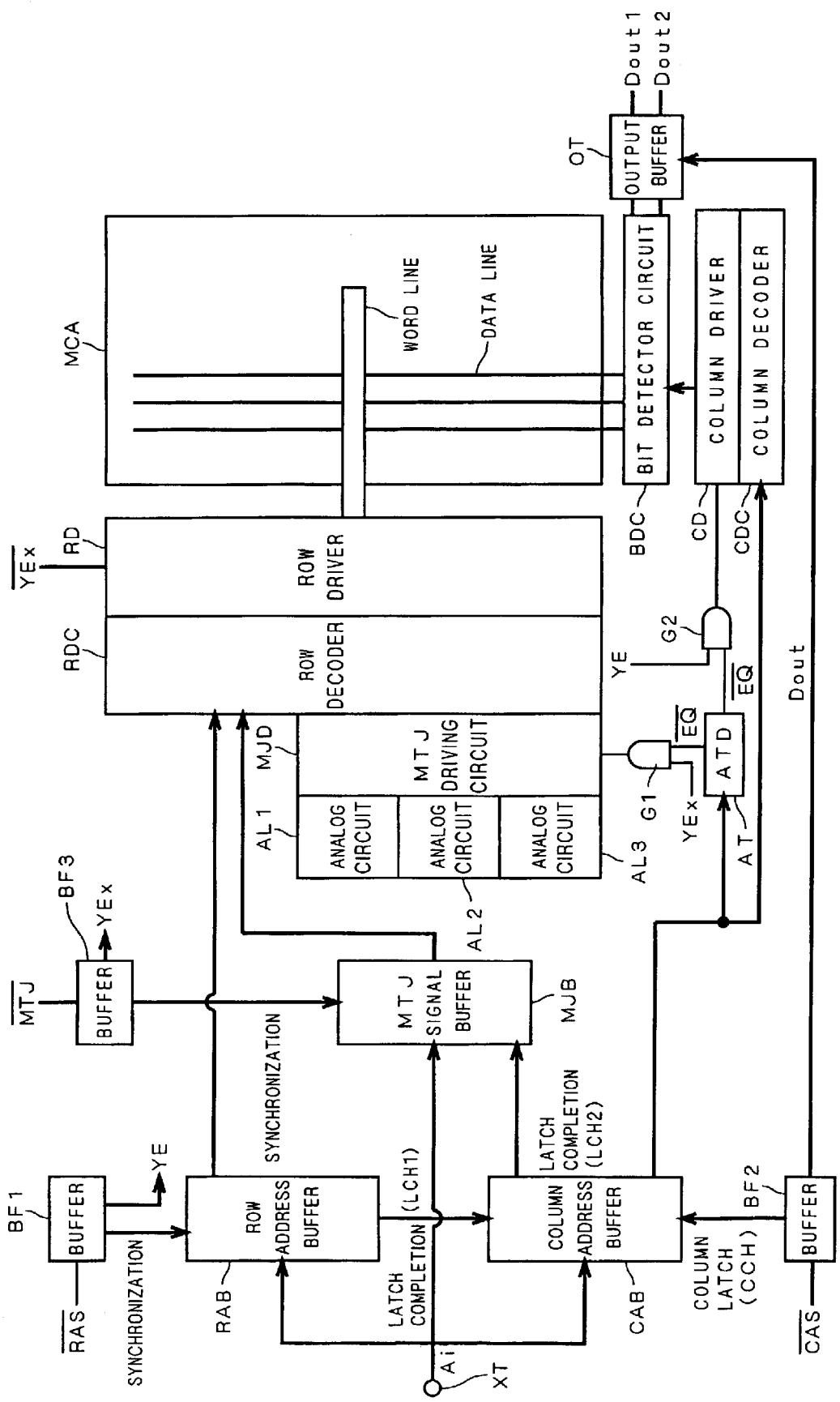
FIG. 21 is a view showing a constitution of a semiconductor memory device having a structure for resistance-value control of the magnetic tunnel resistance element.

FIG. 21 is a block diagram showing a constitution of a semiconductor memory device 100 having a memory cell array MCA, particularly that of the memory cell array MCA and its periphery. Further, as the memory cell array MCA, any memory may be used, such as an SRAM (Static RAM), a DRAM (Dynamic RAM), an MRAM (Magnetic Random Access Memory) and a flash memory.

In FIG. 21, a row driver RD is provided along a side of the memory cell array MCA, a bit detector circuit BDC is provided along another side orthogonal to the above side and an output of the bit detector circuit BDC is connected to an output buffer OT.

A row decoder RDC (word line decoder) is electrically connected to the row driver RD, the bit detector circuit BDC is electrically connected to a column driver CD, and a column decoder CDC (bit line decoder) is electrically connected to the column driver CD.

An MTJ driving circuit MJD for driving the magnetic tunnel resistance elements is electrically connected to the row decoder RDC, and analog circuits AL1, AL2 and AL3 are electrically connected to the MTJ driving circuit MJD. In the analog circuits AL1 to AL3, the filter and the amplifier having the magnetic tunnel resistance elements are provided.

Further, as an address buffer, a row address buffer RAB for selecting a row (word line) of the memory cell array and a column address buffer CAB for selecting a column (data line) are provided.

The row address buffer RAB and the column address buffer CAB shares an address terminal XT to supply two external synchronous clock signals, i.e., a bar RAS signal and a bar CAS signal, in time series.

Thus, a system for using the address terminal XT in a time-division manner is referred to an address signal multiplexing system. With larger capacity, a large package is needed since the number of address terminals increases and this causes a problem that the package density of a system can not increase. The address signal multiplexing, however, can resolve this problem. In a memory mounted on a portable device, particularly, the address signal multiplexing is adopted.

Further, as shown in FIG. 21, the bar RAS signal and the bar CAS signal are supplied to the row address buffer RAB and the column address buffer CAB through buffers BF1 and BF2, respectively.

Further, an output of the row address buffer RAB is given to the row decoder RDC, and the column address buffer CAB is connected to an ATD (Address Transition Detector) circuit AT for detecting the transition of the column address and the column decoder CDC.

An output of the ATD circuit AT is given to the MTJ driving circuit MJD and the column driver CD through AND circuits G1 and G2, respectively. The AND circuit G1 receives a control signal YEx from a buffer BF3 and the AND circuit G2 receives a signal YE from the buffer BF1. Further, the buffer BF2 gives an output control signal Dout to the output buffer OT.

Furthermore, an MTJ signal buffer MJB is connected to the address terminal XT and an output of the MTJ signal buffer MJB is given to the row decoder RDC. The MTJ signal buffer MJB receives a bar MTJ signal through the buffer BF3.

C-2. Operation

Next, a basic operation of the semiconductor memory device 100 will be discussed.

A binary N-bit address signal $A_i$ which is externally inputted to the address terminal XT is captured in the row address buffer RAB as a row address signal by the bar RAS signal and transmitted to the row decoder RDC.

The row decoder RDC selects one of $2^{12}$ (=4096) logic gates whose input is 12-bit (12 pairs of $a_i$ and bar $a_i$) logic information in 16 M bit.

Further, when the row address buffer RAB completely latches the row address, a latch-complete signal LCH1 is given to the column address buffer CAB and the column address buffer CAB latches a column address.

The column address signal is transmitted to the column decoder CDC and the ATD circuit AT. Then, when one row decoder is selected, a row driver (word driver) connected thereto is activated. Specifically, one word line [[WL]] is connected for one row address, and when one address is selected, the corresponding word line is activated.

Further, after receiving the latch-complete signal LCH1 of the row address, the column address buffer CAB can always receive the column address signal without being controlled by the bar CAS signal.

Therefore, the address signal after a certain time period passes from the input of the bar RAS signal is regarded as a valid column address signal, and after that, the column decoder is selected without being controlled by the bar CAS signal and a signal detected by the bit detector circuit BDC is transmitted to the output buffer OT. In this final stage, outputs Dout1 and Dout2 are outputted as outputs of the bit line pair (data line pair) in synchronization with the bar CAS signal.

Thus, since the time period conventionally required for synchronization with the bar CAS signal in the first stage of the column circuit is not needed, the access time from application of the column address to data output decreases by this time period.

Further, since the bar CAS signal serves only to give a column latch signal CCH from the buffer BF2 to the column address buffer CAB to latch the column address and control of the bar CAS signal is performed in the final stage, this does not directly affect the access time.

The ATD circuit AT for detecting the transition of the column address, however, is needed, and an output pulse bar EQ from the ATD circuit AT serves to control the column circuit. The ATD circuit AT issues the output pulse bar EQ every time when the column address is changed. The column circuit is controlled by various pulses which are generated on the basis of this pulse.

Further, the column driver starts its operation with an AND signal of a cell-amplification-complete signal YE outputted from the buffer BF1 and the output pulse bar EQ.

Hereafter, discussion will be made on the resistance-value control of the magnetic tunnel resistance element using the semiconductor memory device 100.

In the semiconductor memory device 100, the row decoder RDC for the memory cell array MCA is also used as a decoder for the resistance-value control, decoding a signal for controlling the resistance value of the magnetic tunnel resistance element, and the MTJ driving circuit MJD can thereby control the resistance value of the magnetic tunnel resistance element.

Specifically, in the semiconductor memory device 100, the row address buffer RAB, the column address buffer CAB and the MTJ signal buffer share one address terminal and properly use the terminal in a time-division manner by supplying it with the bar RAS signal, the bar CAS signal and the bar MTJ signal (including a magnetic tunnel resistance element control signal and an analog circuit driving signal) as external synchronous clock signals in time series.

Herein, the magnetic tunnel resistance element control signal (MTJ control signal) refers to a signal before being decoded into bit information such as the control signals D0, D1, D2 and D3 which are supplied from the decoder DC to the magnetic tunnel resistance elements constituting the variable resistance RZ in the filter FT3 discussed with reference to FIG. 9, for example.

Further, the analog circuit driving signal refers to a signal for controlling supply/cutoff of a power supply voltage (Vcc) and a ground voltage (Vss) for an analog circuit. These voltages are supplied only when a signal for selecting the analog circuit is given and the analog circuit is driven, for reduction in power consumption.

Referring to the timing chart of FIG. 22, discussion will be made below on the resistance-value control of the magnetic tunnel resistance elements in the semiconductor memory device 100.

Figure 22:
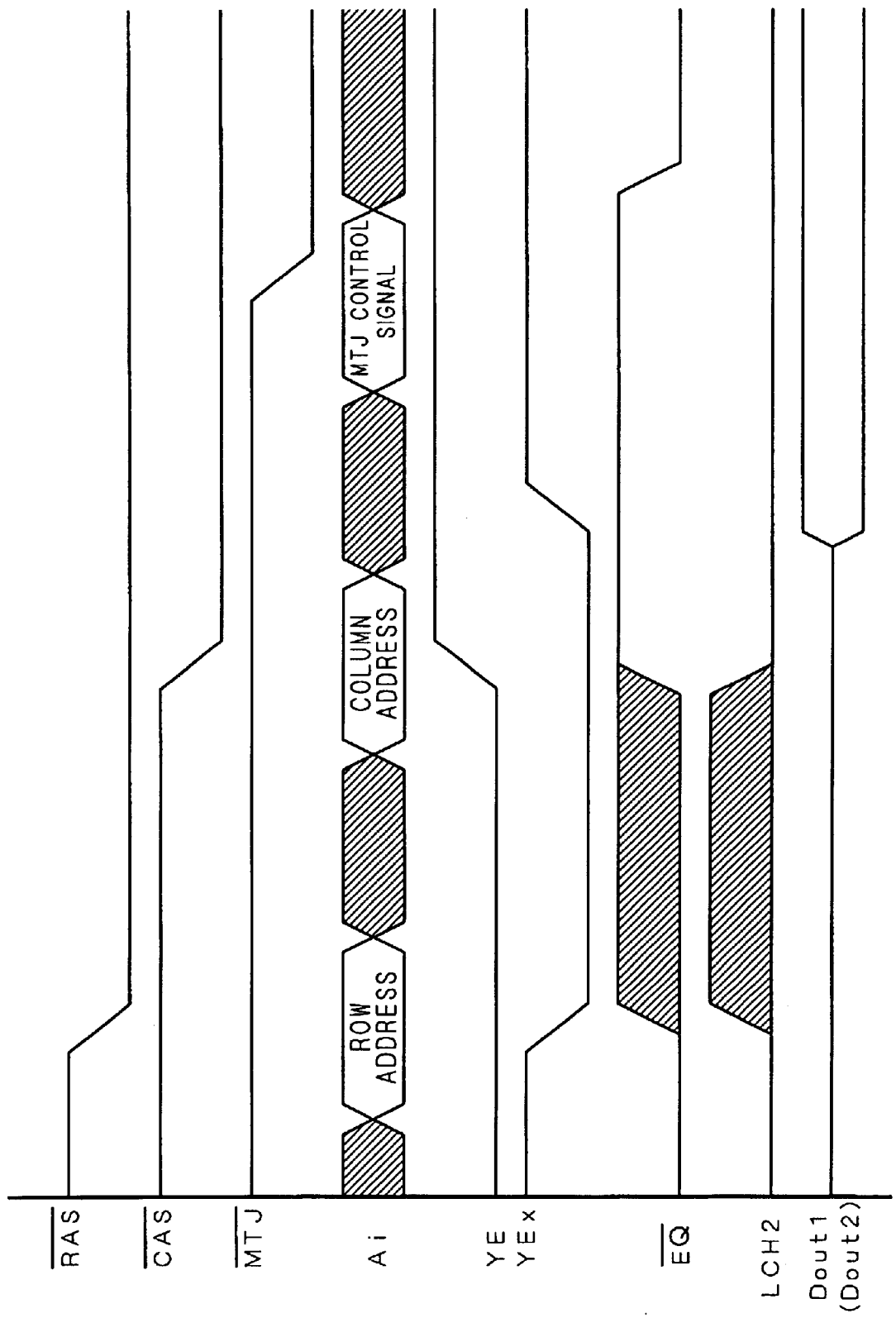
FIG. 22 is a timing chart used for explanation of an operation of the semiconductor memory device having the structure for resistance-value control of the magnetic tunnel resistance element.

As shown in FIG. 22, when the bar MTJ signal is in a low-potential (Low) state, the MTJ control signal is transmitted to the MTJ signal buffer MJB of FIG. 21.

The row address of the memory cell array MCA is decoded by the row decoder RDC, to activate a row specified by the address. A driving circuit used therefor is the row driver RD.

On the other hand, when the row address is completely latched, the column address buffer CAB latches the column address. The ATD circuit AT outputs the bar EQ signal when confirming the transition of the column address. The column driver CD is driven with the AND output (output of the AND circuit G2) of the cell-amplification-complete signal YE outputted from the bar RAS buffer BF1 and the bar EQ signal and the information of the bit line is read out. After that, the bit information (Dout1 and Dout2) is outputted as an output of the bit line pair (data line pair) from the output buffer OT.

While the bit information is outputted, the cell-amplification-complete signal YE is in a high-voltage (High) state. On the other hand, the control signal YEx outputted from the bar MTJ buffer BF3 is in the Low state while the row address and the column address are latched, to inactivate the MTJ driving circuit MJD. Further, as shown in FIG. 21, the MTJ driving circuit MJD is controlled by an AND output (output of the AND circuit G1) of the bar EQ signal and the control signal YEx, and the MTJ control signal transmitted to the row decoder RDC is decoded and then transmitted to the magnetic tunnel resistance elements in the analog circuits AL1 to AL3, to control the resistance values.

The signals latched in the MTJ signal buffer MJB is decoded by the row decoder RDC and converted into signals such as the control signals D0, D1, D2 and D3 shown in FIG. 9. At this time, since the control signal YEx is in the High state, the row driver RD controlled by the bar YEx signal is inactivated. This causes no case where the MTJ control signal is decoded to drive the word line.

In this case, after receiving a latch-complete signal LCH2 of the row address, the buffer BF3 can always receive the MTJ signal without being controlled by the bar MTJ signal.

Therefore, the address signal after a certain time period passes from the input of the bar CAS signal is regarded as a valid MTJ signal, and after that, the row decoder is selected without being controlled by the bar MTJ signal and the signal is transmitted to the MTJ driving circuit MJD. In this final stage, the control signal YEx and the bar MTJ signal are synchronized, to transmit a signal for controlling the resistance values of the magnetic tunnel resistance elements to the analog circuits AL1 to AL3.

Further, outputs from the analog circuits AL1 to AL3 are written into the memory cell array MCA after being converted by an A/D converter (not shown), to record the information.

Furthermore, though the address signal is multiplexed with the row address, the column address and the MTJ control signal in this order in FIG. 22, there are six combinations of order of the signals and needless to say, multiplexing may be performed in any order.

Figure 23:
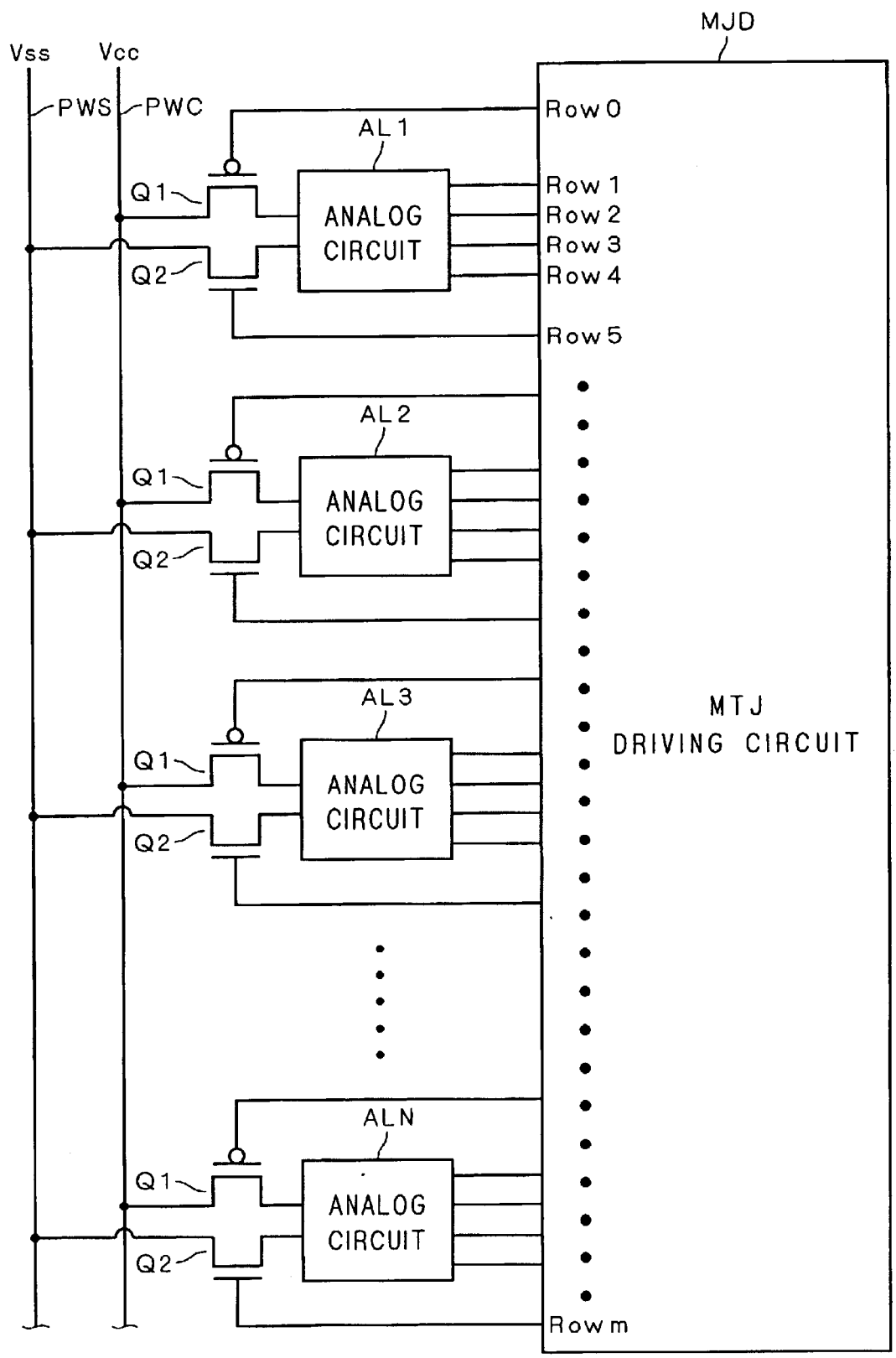
FIG. 23 is a view showing an operation of an MTJ driving circuit.

Next, further discussion will be made on an operation of the MTJ driving circuit MJD. referring to FIG. 23. As shown in FIG. 23, the MTJ driving circuit MJD can select at least one out of a plurality of analog circuits (represented by reference signs AL1, AL2, AL3 . . . ALN, and which input signals to rows Row0, Row1 . . . Rowm) to drive the same, and in order for that, sets the resistance values of the magnetic tunnel resistance elements constituting the variable resistance in the selected analog circuit.

Each of the analog circuits AL1 to ALN includes a pair of P-channel MOS transistor Q1 and N-channel MOS transistor Q2 and is electrically connected to a power-supply voltage supply line PWC and a ground voltage supply line Vss through the MOS transistors Q1 and Q2. Further, the MOS transistors Q1 and Q2 serve as supply/cutoff switches of the power supply voltage Vcc and the ground voltage Vss, respectively, for each analog circuit.

When the analog circuit AL1 controlled by control signals Row0, Row1, Row2, Row3, Row4 and Row5 is selected, for example, by giving a Low signal to the control signal Row0 and a High signal to the control signal Row5, the power supply voltage Vcc and the ground voltage Vss are supplied to the analog circuit AL1. Then, 4-bit information of the control signals Row1, Row2, Row3 and Row4 is used for setting of the resistance values of the magnetic tunnel resistance elements constituting the variable resistance in the analog circuit AL1.

For example, the control signals D0, D1, D2 and D3 shown in FIG. 9, which are given to the variable resistance RZ, correspond to the control signals Row1, Row2, Row3 and Row4, respectively.

C-3. Action and Effect

As discussed above, in the semiconductor memory device 100, by supplying the address signal, being multiplexed with the bar RAS signal, the bar CAS signal and the bar MTJ signal, to the address terminal, the address terminal is properly used in a time-division manner. With this multiplexing, since the MTJ control signal is transmitted in address signal multiplexing manner during a time period after the read/write of the bit information is completed in the operation of the memory cell array and selecting of analog circuit and setting of the resistance values of the magnetic tunnel resistance elements in the selected analog circuit are performed with the MTJ control signal which is decoded by the row decoder, it is advantageously possible to draw a distinction between the arrangement region for the analog circuit and that for the digital circuit and reduce the occupied area as compared with the semiconductor memory device having the conventional analog circuit using different control signal lines for the respective circuits.

Further, since it is not necessary to provide any decoder or control logic unit dedicated to control of the magnetic tunnel resistance values, it is possible to suppress upsizing of the semiconductor memory device integrating the analog circuits using the magnetic tunnel resistance elements.

C-4. Variation

Though the above discussion shows the constitution of the semiconductor memory device 100 in which the row decoder is used also as the decoder for the MTJ control signal, the column decoder may be used also as the decoder for the MTJ control signal.

Herein, discussion will be made on a semiconductor memory device 100A as a variation of the semiconductor memory device 100, referring to FIG. 24.

In the semiconductor memory device 100A, constituent elements identical to those in the semiconductor memory device 100 of FIG. 21 are represented by the same reference signs, and redundant discussion will be omitted.

Figure 24:
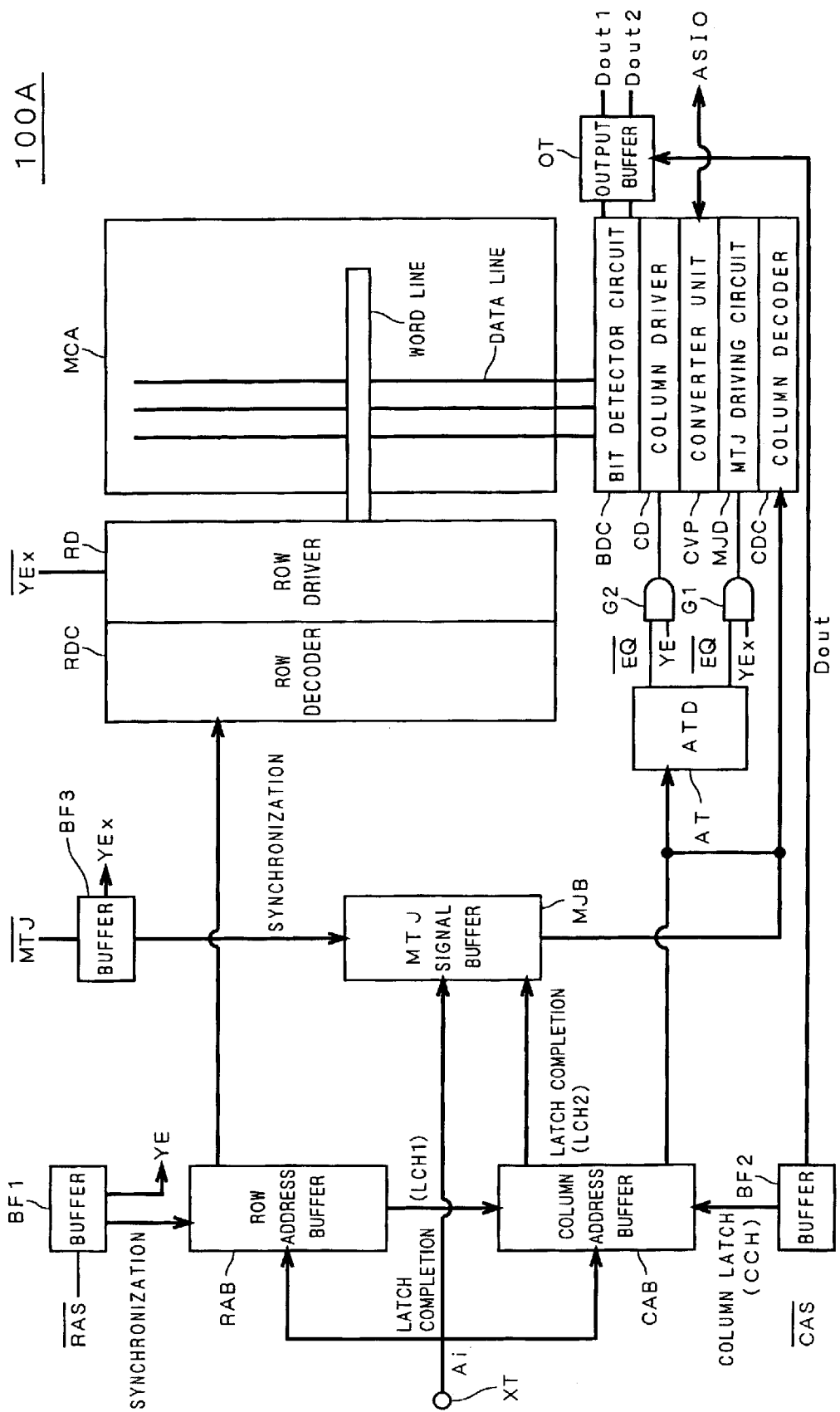
FIG. 24 is a view showing another constitution of the semiconductor memory device.

As shown in FIG. 24, the bit detector circuit BDC is electrically connected to the column driver CD, the column driver CD is electrically connected to the MTJ driving circuit MJD through a converter unit CVP and the MTJ driving circuit MJD is electrically connected to the column decoder CDC. The converter unit CVP includes an A/D converter and a D/A converter, having a function of externally transmitting an analog input/output signal ASIO. Further, an output of the MTJ signal buffer MJB is given to the column decoder CDC.

In the semiconductor memory device 100A having such a constitution, in a case of conversion from an externally-inputted address signal into a digital signal, for example, by supplying the address signal $A_i$ multiplexed with at least one row address signal, at least one column address signal and the MTJ control signal in this order, the information is latched in the buffers.

With transition of the column address, the column driver CD comes into an ON state. In the column decoder CDC, the column address is decoded in time series, and subsequently the MTJ control signal is decoded. The MTJ control signal includes the control signals Row0 and Row5 for controlling supply/cutoff of the power supply voltage Vcc and the ground voltage Vss for the analog circuit and the control signals Row1 to Row4 for setting the resistance values of the magnetic tunnel resistance elements constituting the variable resistance in the analog circuit.

When the control signal YEx is outputted from the bar MTJ buffer BF3, the bar EQ signal is outputted from the ATD circuit AT every time when the column address is changed. Then, the MTJ driving circuit MJD is brought into an ON state by the bar EQ signal and the control signal YEx, and the MTJ control signal decoded by the column decoder CDC is given to the magnetic tunnel resistance elements constituting the variable resistance in the converter unit CVP to set the resistance values.

Therefore, in a case where the bit string specified by the column address is driven by the column driver CD, when an analog signal is inputted to the converter unit CVP, for example, the analog signal is converted into a digital signal and the digital signal is written into the memory cell array MCA. On the other hand, it is also possible to output an analog signal by reading out the digital information stored at the specified address in the memory cell array MCA and converting the digital signal into the analog signal by the D/A converter in the converter unit CVP.

As discussed above, in the semiconductor memory device 100A, by controlling the resistance values of the variable resistance in the converter unit CVP, it is possible to uniformize the analog/digital conversion rate and digital/analog conversion rate among the bit strings.

D. The Fourth Preferred Embodiment

Though the magnetic tunnel resistance elements are used in the filter and amplifier in the above-discussed first and second preferred embodiments of the present invention, these cases are only examples and the magnetic tunnel resistance elements may be used in various analog circuits such as shown below. As the fourth preferred embodiment, various analog circuits in which the magnetic tunnel resistance elements can be used will be discussed.

D-1. Application to Differential Amplifier

Figure 25:
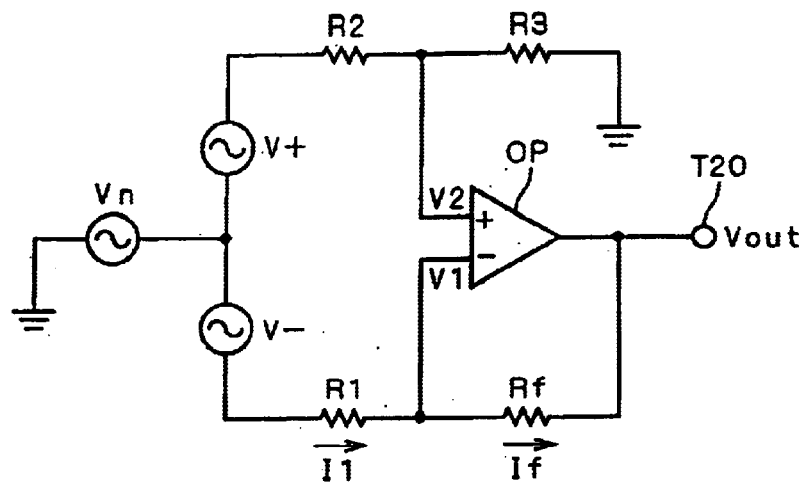
FIG. 25 is a view showing a configuration of a differential amplifier.

FIG. 25 shows a configuration of a differential amplifier using an operational amplifier.

The differential amplifier shown in FIG. 25 is a receiver circuit in a case of balanced transmission of a common mode noise Vn, and a voltage $V_{31}$ is supplied to a wire connected to the inverting input terminal (on the − side) of the operational amplifier OP and a voltage $V_+$ is supplied to a wire connected to the noninverting input terminal (on the + side).

Further, the inverting input terminal of the operational amplifier OP is connected to the connection node between the resistors R1 and Rf which are connected in series to each other, and the resistor Rf is connected to the output terminal T20 of the operational amplifier OP. The noninverting input terminal of the operational amplifier OP is connected to the connecting node between the resistors R2 and R3 which are connected in series to each other, and the resistor R3 is connected to the ground potential.

Furthermore, it is assumed that the voltage V1 is supplied to the inverting input terminal and the voltage V2 is supplied to the noninverting input terminal, and a current flowing across the resistor R1 is I1 and a current flowing across the resistor R2 is I2.

As shown in FIG. 25, since a voltage (Vn+V$_+$) is supplied to the + side of the operational amplifier OP, the voltage V2 is expressed by the following equation (29):

$$V2 = (Vn + V_+) \frac{R3}{R2+R3} \quad (29)$$

Further, since I1=If and V2=V1 (because the input impedance of the differential amplifier should be ideally infinite), the currents I1 and If are expressed by the following equation (30):

$$I1 = \frac{Vn + V_- - V2}{R1} = If = \frac{V2 - Vout}{Rf} \quad (30)$$

Combining Eqs. (29) and (30), the following equation (31) is obtained:

$$Vout = Vn\left(\frac{R3}{R2+R3} - \frac{Rf}{R1} + \frac{Rf}{R1} \times \frac{R3}{R2+R3}\right) + V_+\left(\frac{R3}{R2+R3} + \frac{Rf}{R1} \times \frac{R3}{R2+R3}\right) - V_-\left(\frac{Rf}{R1}\right) \quad (31)$$

In this equation, in order to bring the first term relating to the common mode noise Vn into 0, it is only necessary to satisfy the relation Rf/R1=R3/R2. If the condition is satisfied, since the common mode noise Vn becomes irrelevant to the output, the following equation (32) is obtained from Eq. (31):

$$Vout = \frac{Rf}{R1}(V_+ - V_-) \quad (32)$$

Assuming herein that coefficients of the first, second and third terms are $G_n$, $G_+$ and $G_-$, respectively, the following equations (33), (34) and (35) are obtained:

$$G_n = \frac{R3}{R2+R3} - \frac{Rf}{R1} + \frac{Rf}{R1} \times \frac{R3}{R2+R3} \quad (33)$$

$$G_+ = \frac{R3}{R2+R3} + \frac{Rf}{R1} \times \frac{R3}{R2+R3} \quad (34)$$

$$G_- = \frac{-Rf}{R1} \quad (35)$$

Herein, the ratio of ($G_+ - G_-$) to the $G_n$ is referred to as common mode rejection ratio, and abbreviated as CMR. The CMR is expressed by the following equation (36):

$$CMR = \frac{|G_+ - G_-|}{|G_n|} \quad (36)$$

It is preferable that the CMR should be as large as possible, and in order to make the CMR larger, it is necessary to make $G_n$ 0, in other words, satisfy the relation Rf/R1=R3/R2. In order to satisfy the relation Rf/R1=R3/R2, for example, it is only necessary to use the variable resistance Rx constituted of the magnetic tunnel resistance elements discussed with reference to FIG. 18 to constitute the resistor Rf or the resistor R3 and control the resistance with a program so that the above condition should be precisely satisfied.

D-2. Application to Comparator

Figure 26:
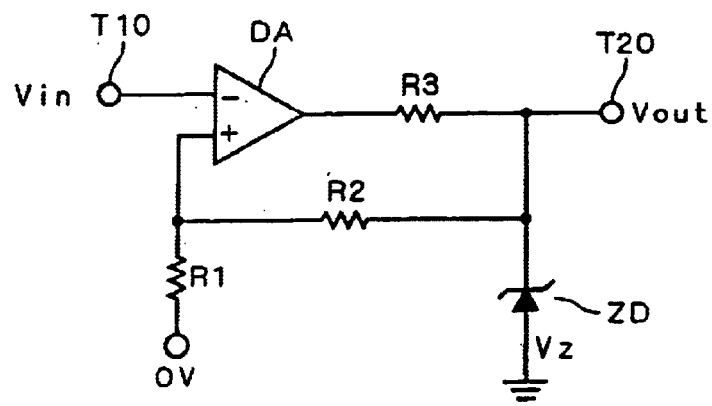
FIG. 26 is a view showing a configuration of a comparator.

FIG. 26 shows a configuration of a comparator using a differential amplifier.

FIG. 26 shows a comparator for judging whether one input is larger than the other input or not by using a − terminal and a + terminal of a differential amplifier DA.

In FIG. 26, the − terminal of the differential amplifier DA is connected to the terminal T10, being supplied with the input voltage Vin, and an output of the differential amplifier DA is given as the output voltage Vout to the output terminal T20 through the resistor R3.

Further, the + terminal of the differential amplifier DA is connected to the potential of 0 V through the resistor R1, and the resistor R2 is connected between the + terminal and the output terminal T20. The end portions of the resistors R2 and R3 on the side of the output terminal T20 are also connected to a cathode of a Zener diode ZD (having a breakdown voltage of Vz volt) and an anode of the Zener diode ZD is connected to the ground potential.

In the comparator of FIG. 26, assuming that the voltage of 0 V supplied to the + terminal of the differential amplifier DA is a threshold value, if the input is higher than the threshold value, the output is made 0 V and if the input is lower, the output is made − Vz volt.

When the input has a minute change due to a noise or the like near 0 V which is the threshold value, there is a possibility that the output of the comparator should have an unmeaningful change. In order to avoid this, it is necessary to allow a margin for the threshold value, and specifically, when the input is changed from a low voltage to a high voltage, the output should not be changed until the voltage becomes slightly higher than the threshold value and when the input is changed from a high voltage to a low voltage, the output should not be changed until the voltage becomes slightly lower than the threshold value.

These change points are referred to as an upper trip point (UTP) and a lower trip point (LTP), respectively. This means that the output depends on not only the present input but also the already-made output, and in other words, the comparator has hysteresis.

Figure 27:
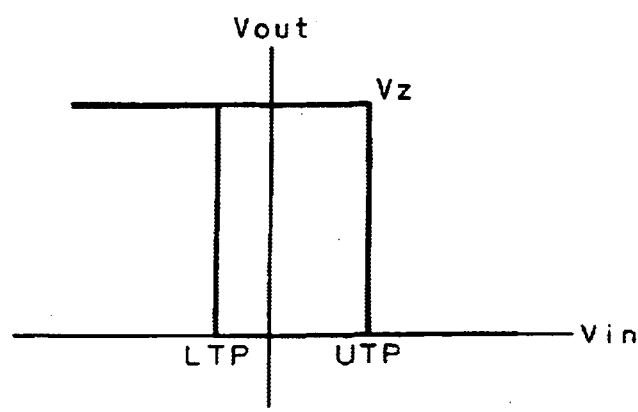
FIG. 27 is a view showing the hysteresis characteristic of the comparator.

FIG. 27 shows the hysteresis characteristic of the comparator. In FIG. 27, the horizontal axis represents the input voltage Vin the vertical axis represents the output voltage Vout.

In the comparator of FIG. 26, the resistors R1 and R2 are elements to provide the above hysteresis characteristic.

Assuming herein that the breakdown voltage of the Zener diode ZD is Vz and the voltage drop in a forward direction is $V_F$, when the input is positive, a reverse bias is applied to the Zener diode ZD and then a feedback voltage of the differential amplifier DA is supplied thereto to bring the output voltage into Vz. When the output voltage is made Vz, the Zener diode ZD is broken down and performs such an operation as keep the output voltage Vz while being in the breakdown state.

Therefore, a voltage obtained by dividing the voltage Vz by the resistors R1 and R2 to the + terminal of the differential amplifier DA, and since the output is inverted when the input exceeds the above voltage, the UTP is expressed by the following equation (37):

$$UTP = V_z \times \frac{R1}{R1 + R2} \qquad (37)$$

Further, when the input is negative, a forward bias is applied to the Zener diode ZD and since the voltage drop in this case is $V_F$, the output voltage becomes $-V_F$ with the ground potential as reference and a terminal voltage of the differential amplifier DA on the + side is changed to supply the LTP lower than the UTP. The LTP is expressed by the following equation (38):

$$LTP = -V_F \frac{R1}{R1 + R2} \qquad (38)$$

In the comparator of FIG. 26, for example, by using a variable resistance including at least one magnetic tunnel resistance element (e.g., the variable resistance Rx discussed with reference to FIG. 18) to constitute the resistors R1 and R2, it is possible to control the voltages of the LTP and the UTP by a program.

D-3. Application to Analog Computer

Figure 28:
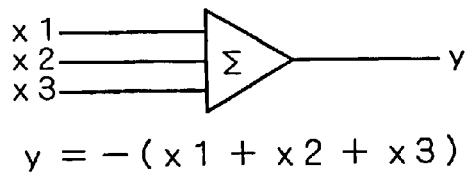
FIG. 28 is a view showing a configuration of an adder.
Figure 29:
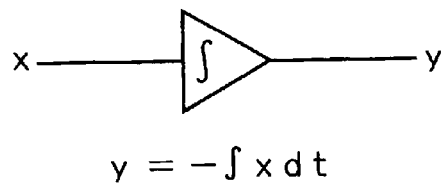
FIG. 29 is a view showing a configuration of a integrator.
Figure 30:
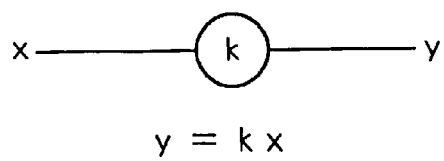
FIG. 30 is a view showing a configuration of a multiplier.

With an operational amplifier, addition and integral can be easily performed. FIGS. 28, 29 and 30 show symbols for main operational elements of the analog computer.

Specifically, FIG. 28 shows an adder for adding inputted x1, x2 and x3 to output a negative value y, FIG. 29 shows an integrator for integrating inputted x to output an integral value y, and FIG. 30 shows a multiplier, such as a resistance type potential divider or an amplifier, for multiplying inputted x by a coefficient k to output a value y.

Exemplary constitutions of an analog computer which uses these operational elements in combinations to efficiently solve a high-order differential equation will be shown below.

D-3-1. The First Example of Analog Computer

Figure 31:
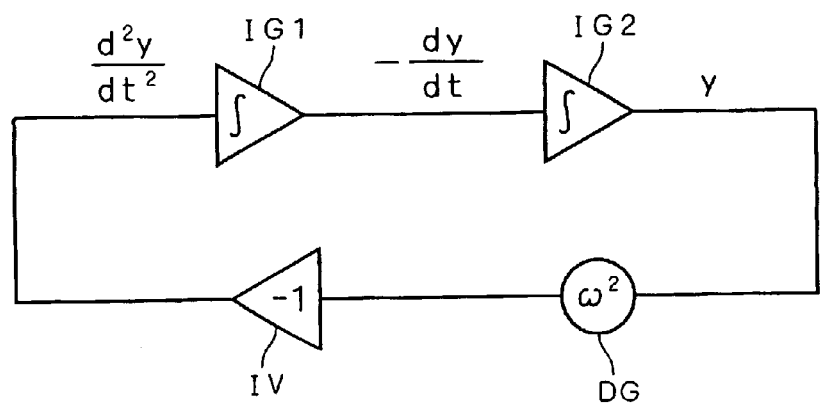
FIG. 31 is a view showing a configuration of an analog computer.

FIG. 31 shows an analog computer for solving a differential equation expressed by the following equation (39):

$$\frac{d^2 y}{dt^2} + \omega^2 y = 0 \qquad (39)$$

In the analog computer of the FIG. 31, an integrator IG1 for integrating $d^2y/dt^2$, an integrator IG2 for integrating $-dy/dt$, a multiplier DG for multiplication using the coefficient $\omega^2$ and an −1 times amplifier IV form a loop in this order, to provide the following equation (40) as the solution of Eq. (39):

$$y=A \cos(\omega \cdot t + \theta) \qquad (40)$$

From Eq. (40), it is found that an output of sine wave is obtained as y. The amplitude and phase of this sine wave depend on an initial condition, and if t=0, y=A, dy/dt=0, for example, the sine wave is expressed by the following equation (41):

$$y=A \cos \omega t \qquad (41)$$

Figure 32:
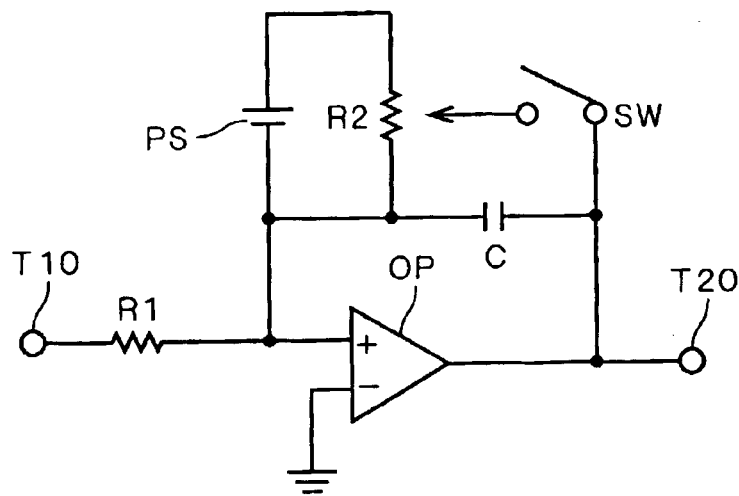
FIG. 32 is a view showing a specific configuration of the integrator.

In order to provide the initial condition, it is convenient to provide a circuit in which a voltage across both terminals of a capacitor used for each integrator is a desired voltage, as shown in FIG. 32.

Specifically, in FIG. 32, the resistor R1 is interposed between the input terminal T10 and the input of the operational amplifier OP, the capacitor C is interposed between the input terminal of the operational amplifier OP and the output terminal T20, one electrode of the capacitor C is connected to a positive pole of a DC power supply PS through the variable resistance R2, and a negative pole of the DC power supply PS is connected to the input of the operational amplifier OP. Further, the other electrode of the capacitor C is connected to a switch for switching the variable resistance R2.

In such a circuit, the switch SW is closed until the operation of the analog computer starts and by opening the switch SW after the operation of the analog computer starts, the integrator operates with a voltage at an operation starting point as an initial value.

Further, by using a variable resistance including at least one magnetic tunnel resistance element (e.g., the variable resistance Rx discussed with reference to FIG. 18) to constitute the variable resistance R2, it is possible to program the initial condition of the integrator.

Furthermore, by using a variable resistance including at least one magnetic tunnel resistance element to constitute the multiplier DG (formed of a resistance type potential divider, an amplifier or the like) which is a constituent of the analog computer shown in FIG. 31, it is possible to program the frequency of the sine wave to be outputted.

D-3-2. The Second Example of Analog Computer

Figure 33:
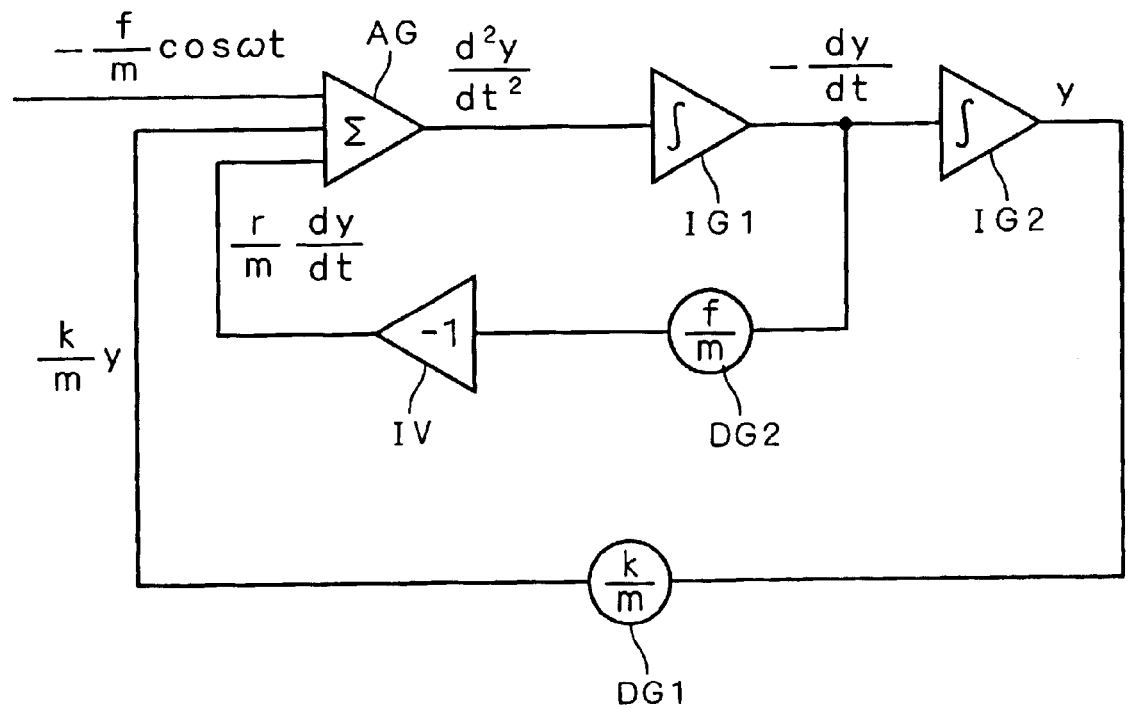
FIG. 33 is a view showing a configuration of the analog computer.

FIG. 33 shows an analog computer for solving a differential equation expressed by the following equation (42):

$$m\frac{d^2 y}{dt^2} + r\frac{dy}{dt} + ky = F \qquad (42)$$

In the analog computer of the FIG. 33, an adder AG, the integrator IG1 for integrating $d^2y/dt^2$, the integrator IG2 for integrating −dy/dt and a multiplier DG1 for multiplication using the coefficient k/m form a loop in this order. Further, an output of the integrator IG1 is given to a multiplier DG2 for multiplication using the coefficient r/m, an output of the multiplier DG2 is given to the −1 times amplifier IV and an output of the −1 times amplifier IV is given to the adder AG.

Furthermore, −f cos ωt/m is given to an input of the adder AG from an oscillator which is separately provided.

Assuming herein that an external force F is a force changing in a sine wave manner of F=f cos ωt, Eq. (42) is transformed into the following equation (43):

$$\frac{d^2 y}{dt^2} = -\frac{r}{m}\frac{dy}{dt} - \frac{k}{m}y + \frac{f}{m}\cos\omega t \quad (43)$$

In the analog computer of FIG. 33, the terms on the right side of Eq. (43) with minus sign are added by the adder AG, to obtain $d^2y/dt^2$. This is put through the integrator IG1, to obtain dy/dt and a signal y.

By observing the signal y obtained thus, it is possible to obtain the solution of the differential equation (herein, the movement of a substance having a mass m).

In this case, by using a variable resistance including at least one magnetic tunnel resistance element to constitute the resistor which is a constituent of the adder, the integrator and the multiplier (resistance type potential divider, amplifier or the like) constituting the analog computer of FIG. 33, it is possible to solve the differential equation with an arbitrary coefficient by a program. This also applies an analog computer including a differentiator besides the above components.

Figure 34:
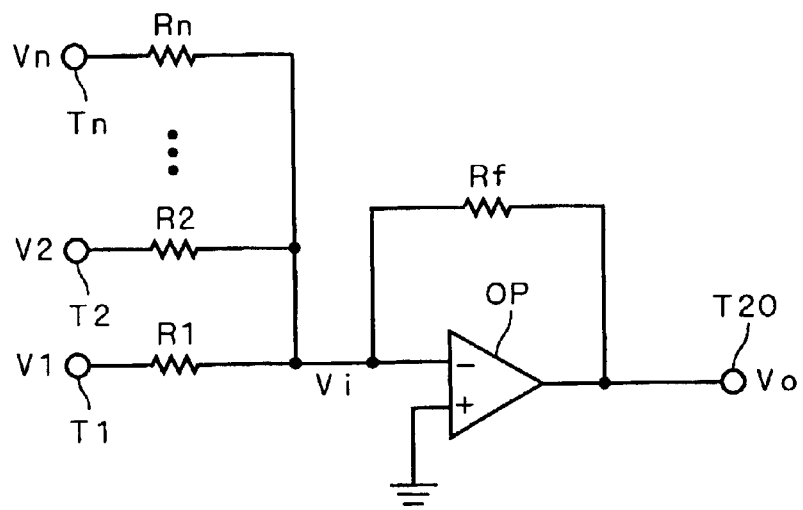
FIG. 34 is a view showing a specific configuration of the adder.

Further, FIG. 34 shows an exemplary configuration of an adder.

As shown in FIG. 34, the resistors R1 to Rn are interposed between a plurality of input terminals T1 to Tn and the inverting input terminal of the operational amplifier OP, respectively, and the feedback resistor Rf is interposed between the inverting input terminal of the operational amplifier OP and the output terminal T20. Further, the noninverting input terminal of the operational amplifier OP is connected to the ground potential.

The adder having such a constitution can bring the input voltage Vi supplied to the inverting input terminal into 0 if the gain of the operational amplifier OP is sufficient large, and since the input impedance of the operational amplifier OP is high, from the fact that the sum of input currents is equal to the current flowing across the feedback resistor Rf, the output voltage Vo is expressed by the following equation (44):

$$V_0 = -\left(\frac{Rf}{R1}V1 + \frac{Rf}{R2}V2 + \ldots \frac{Rf}{Rn}Vn\right) \quad (44)$$

In other words, the output voltage of the circuit is a weighted sum of the input voltage. In this case, by using a variable resistance including at least on magnetic tunnel resistance element to constitute the resistors of FIG. 34, it is possible to achieve the weighted sum of various values by a program control.

Figure 35:
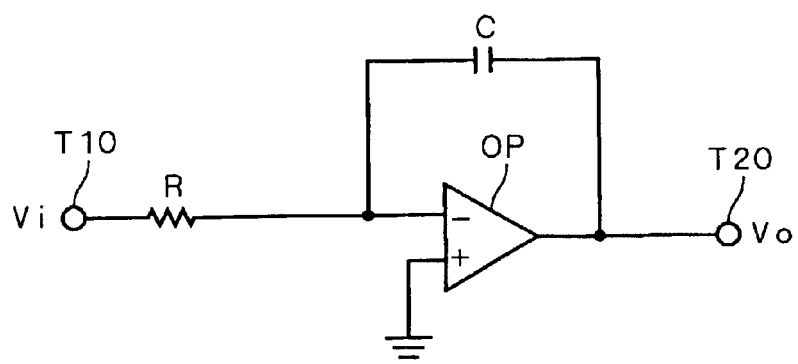
FIG. 35 is a view showing a specific configuration of the integrator.

Further, FIG. 35 shows an exemplary configuration of an integrator.

In the integrator of FIG. 35, the resistor R is interposed between the input terminal T10 and the inverting input terminal of the operational amplifier OP, and the capacitor C is interposed between the inverting input terminal of the operational amplifier OP and the output terminal T20. Further, the noninverting input terminal of the operational amplifier OP is connected to the ground potential.

Assuming that the input voltage Vi supplied to the input terminal T10 is Vi, the output voltage Vo of the integrator shown in FIG. 35 is expressed by the following equation (45):

$$V_0 = -\frac{1}{RC}\int V_i dt \quad (45)$$

Thus, the output voltage of the integrator is an integral of the input voltage. In this case, by using a variable resistance including at least one magnetic tunnel resistance element to constitute the resistors, it is possible to achieve various integrals by a program control.

Figure 36:
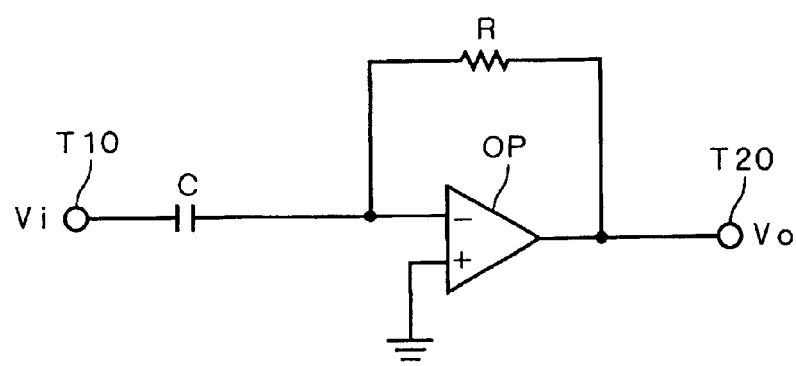
FIG. 36 is a view showing a specific configuration of a differentiator.

Further, FIG. 36 shows an exemplary configuration of an differentiator.

In the differentiator of FIG. 36, the capacitor C is interposed between the input terminal T10 and the inverting input terminal of the operational amplifier OP, and the resistor R is interposed between the inverting input terminal of the operational amplifier OP and the output terminal T20. Further, the noninverting input terminal of the operational amplifier OP is connected to the ground potential.

Assuming that the input voltage Vi supplied to the input terminal T10 is Vi, the output voltage Vo of the differentiator shown in FIG. 36 is expressed by the following equation (46):

$$V_0 = -RC\frac{dV_i}{dt} \quad (46)$$

Thus, the output voltage of the differentiator is an differential of the input voltage. In this case, by using a variable resistance including at least one magnetic tunnel resistance element to constitute the resistors, it is possible to achieve differentials with various coefficients by a program control.

D-4. Application to Current/Current Converter Circuit

Using an operational amplifier, it is possible to obtain a current proportional to a signal source voltage regardless of an impedance of a signal source or an impedance of a load and an output voltage proportional to a signal source current. A circuit operating therefor is referred to as a current/current converter circuit.

Figure 37:
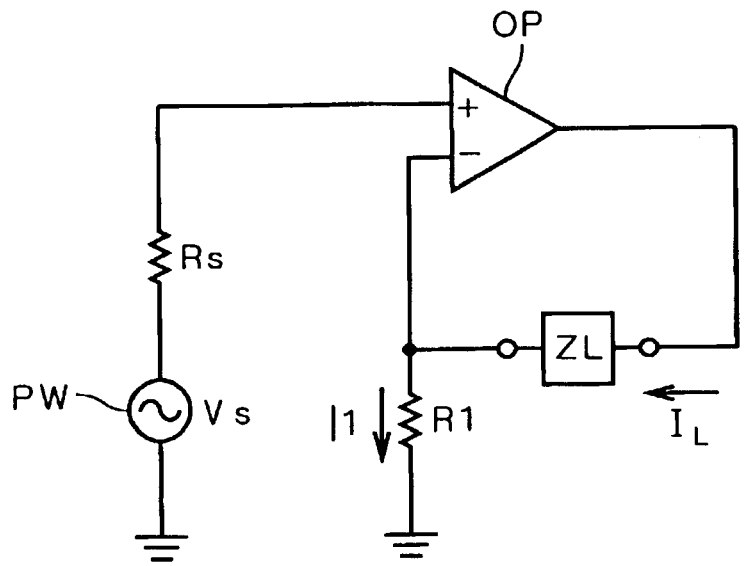
FIGS. 37 and 38 are views each showing a specific configuration of a voltage/current converter circuit.

FIG. 37 shows a converter circuit for converting a voltage into a current.

In FIG. 37, the output voltage Vs of a power supply PW is supplied to the noninverting input terminal of the operational amplifier OP through the resistor Rs, and a load impedance ZL is connected between the inverting input terminal and the output terminal of the operational amplifier OP. Further, the inverting input terminal of the operational amplifier OP is connected to the ground potential through the resistor R1.

Assuming herein that a load current $I_L$ flowing in the load impedance ZL is equal to the current I1 flowing across the resistor R1, since the potential difference of the input terminals of the operational amplifier OP is ideally 0, the following equation (47) holds:

$$R1 \times I_L = Vs \quad (47)$$

Therefore, the load current $I_L$ is expressed by the following equation (48):

$$I_L = \frac{V_S}{R1} \quad (48)$$

From Eq. (48), it is found that the load current $I_L$ is determined regardless of the resistor Rs or the load impedance ZL.

In this case, by using a variable resistance including at least one magnetic tunnel resistance element (e.g., the variable resistance Rx discussed with reference to FIG. 18) to constitute the resistor R1, it is possible to obtain the load current $I_L$ having an arbitrary magnitude.

Figure 38:
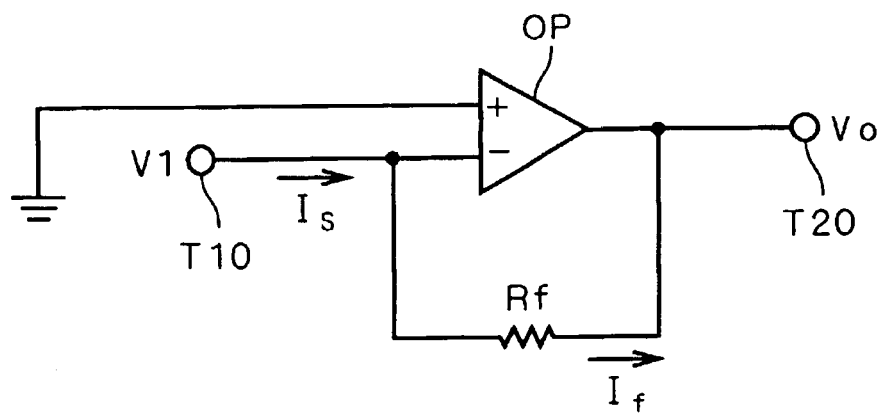
Figure 39:
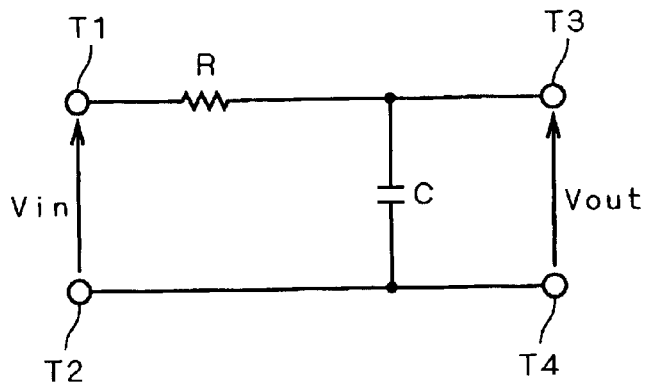
FIG. 39 is a view showing a configuration of a general-type low-pass filter.
Figure 40:
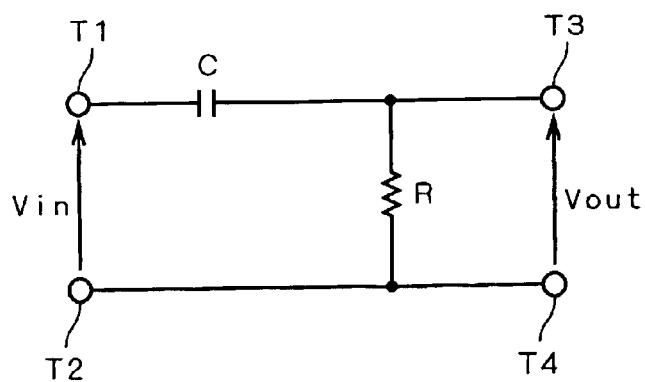
FIG. 40 is a view showing a configuration of a general-type high-pass filter.
Figure 41:
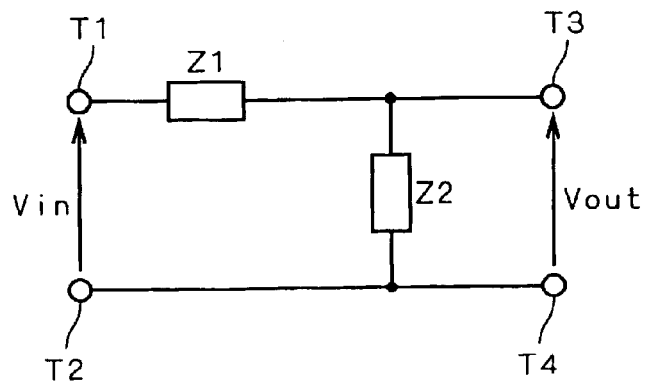
FIG. 41 is a view showing a configuration of an L-shaped primary filter.
Figure 4:
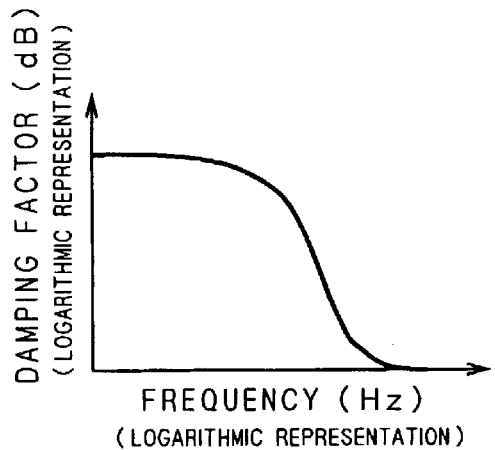
Figure 4:
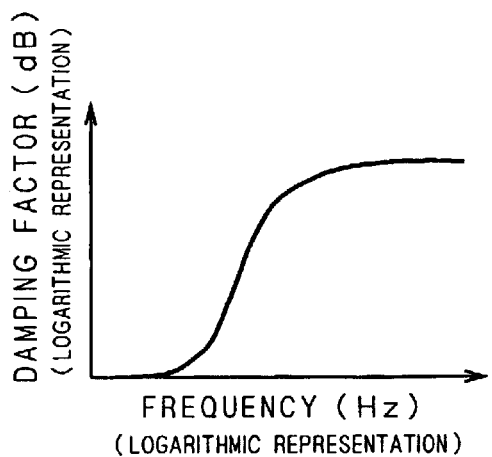
Figure 4:
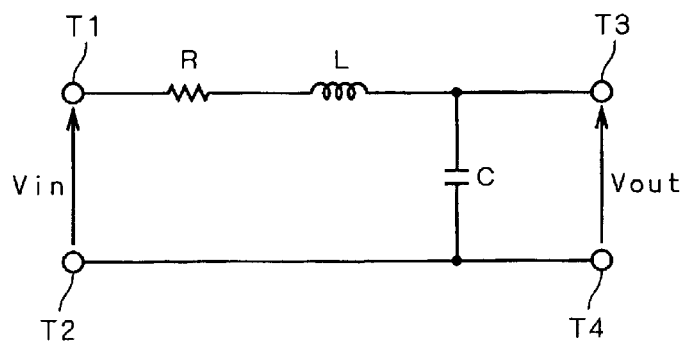
Figure 45:
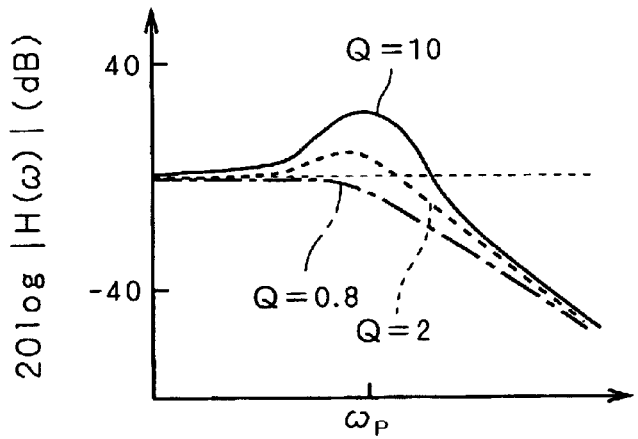
FIG. 45 is a graph showing characteristics of the general-type L-shaped secondary low-pass filter.
Figure 46:
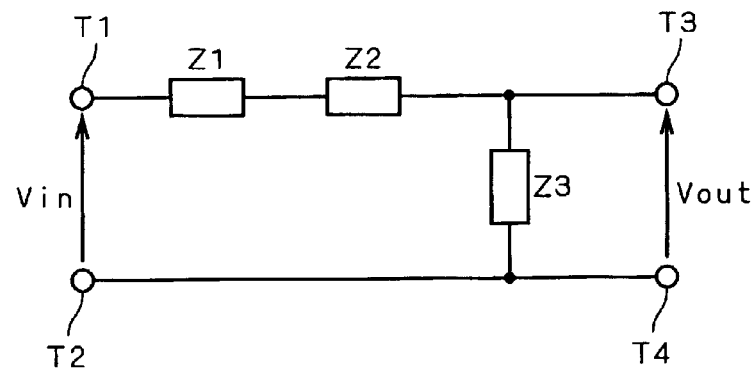
FIGS. 46 and 47 are view showing a configuration of the L-shaped secondary filter.
Figure 47:
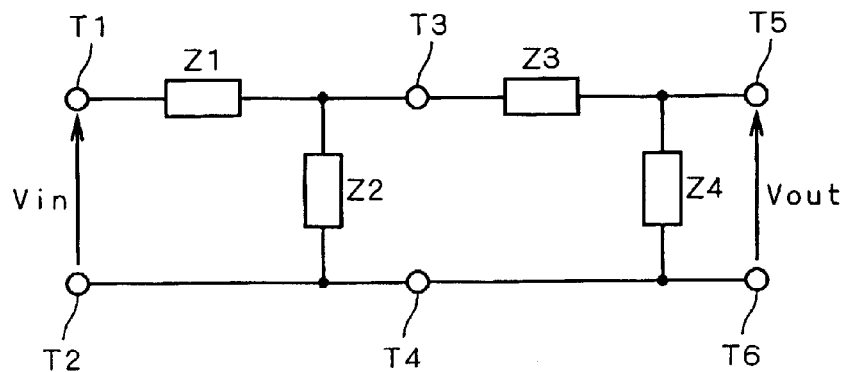
Figure 48:
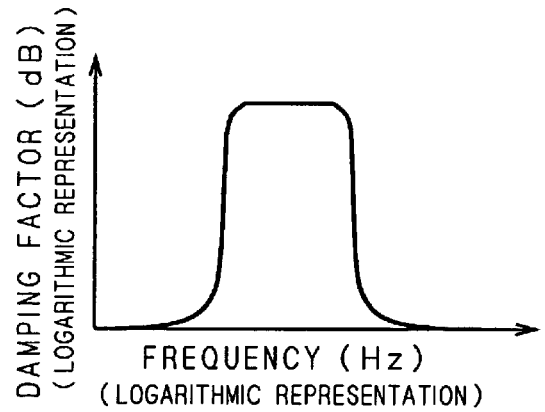
FIG. 48 is a graph showing characteristics of the L-shaped secondary filter.
Figure 49:
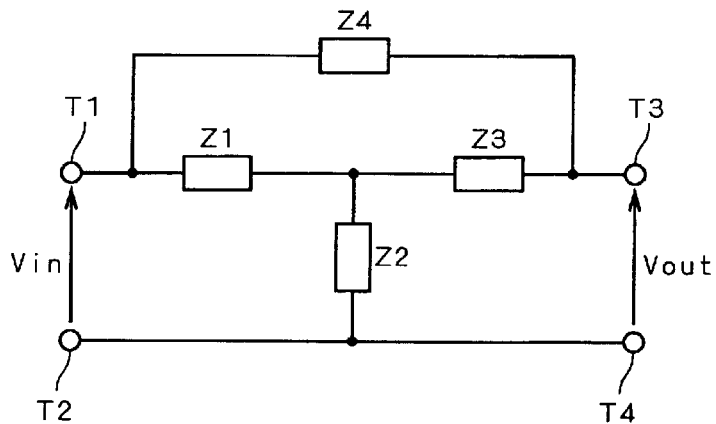
FIG. 49 is a view showing a configuration of a T-shaped bridge secondary filter.
Figure 50:
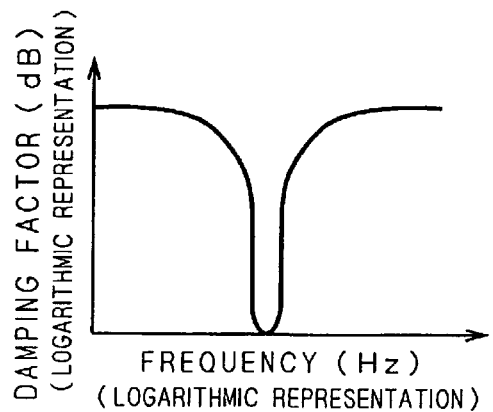
FIG. 50 is a graph showing characteristics of the T-shaped bridge secondary filter.
Figure 5:
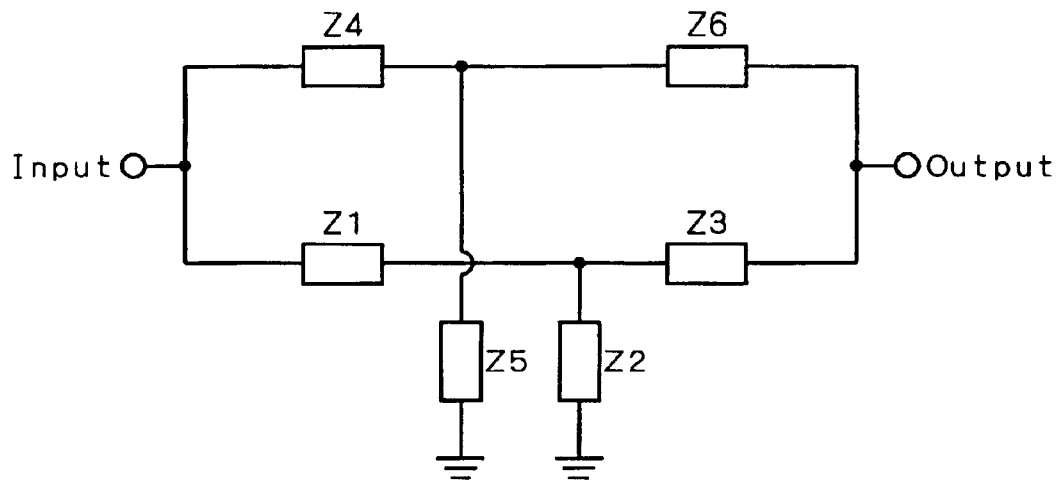
Figure 5:
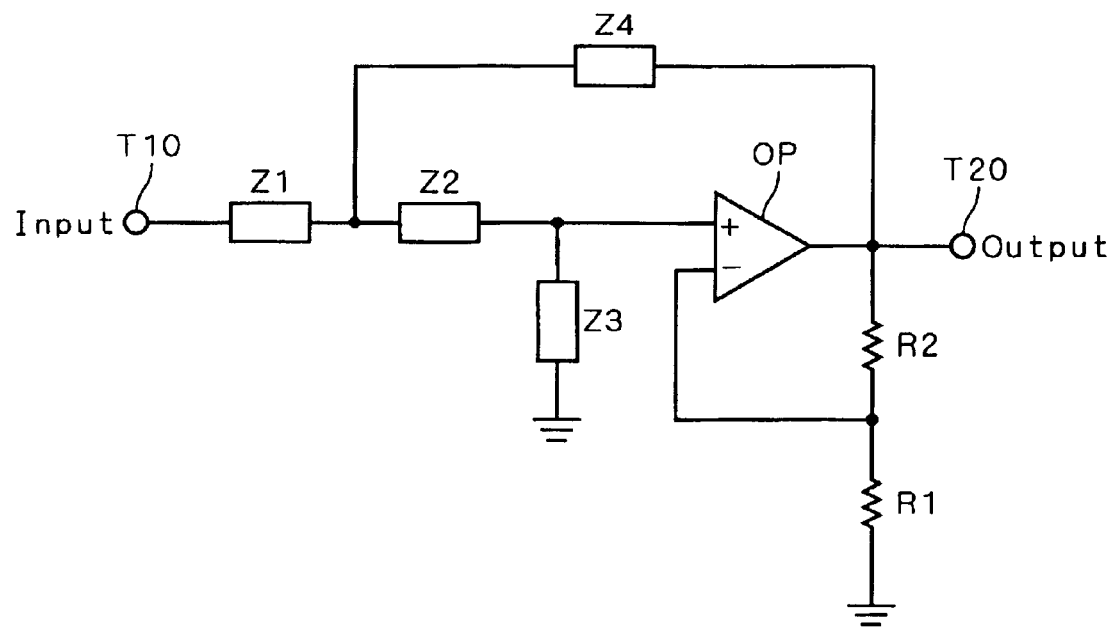
Figure 5:
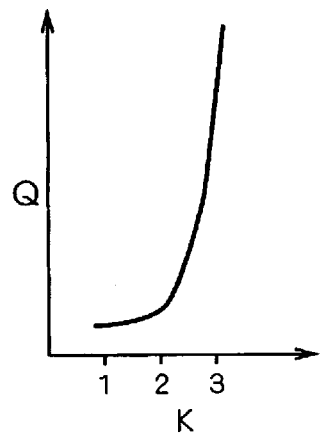
Figure 5:
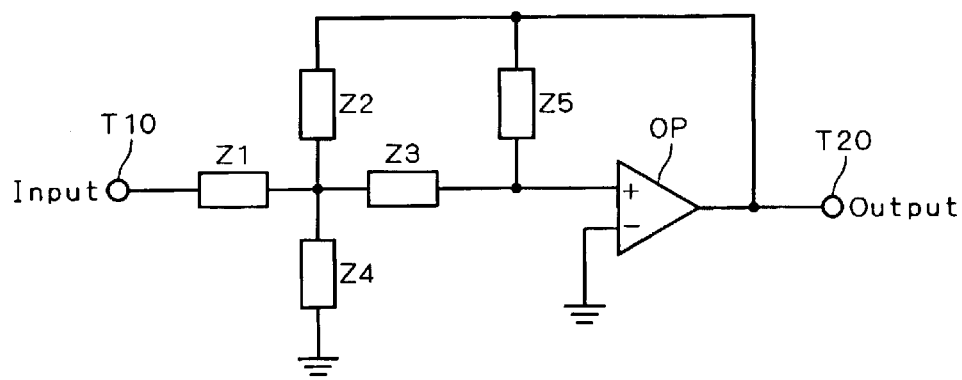
Figure 5:
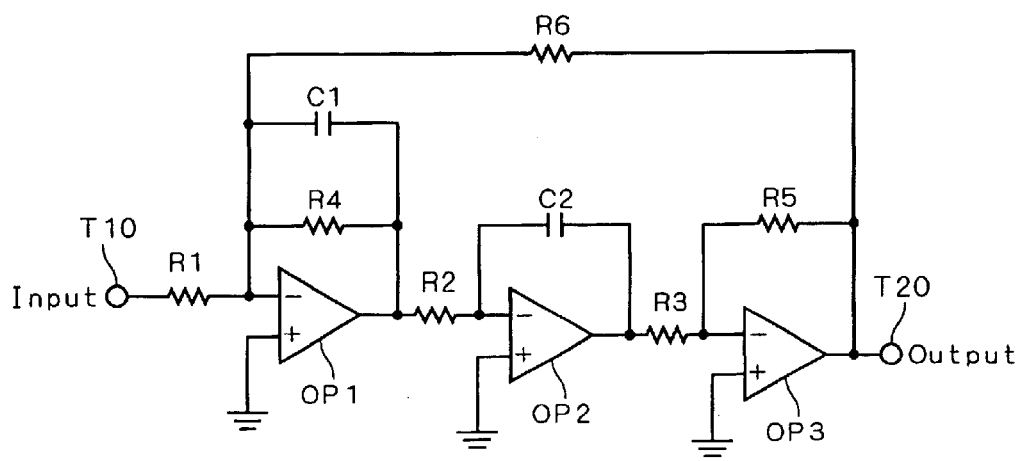
Figure 5:
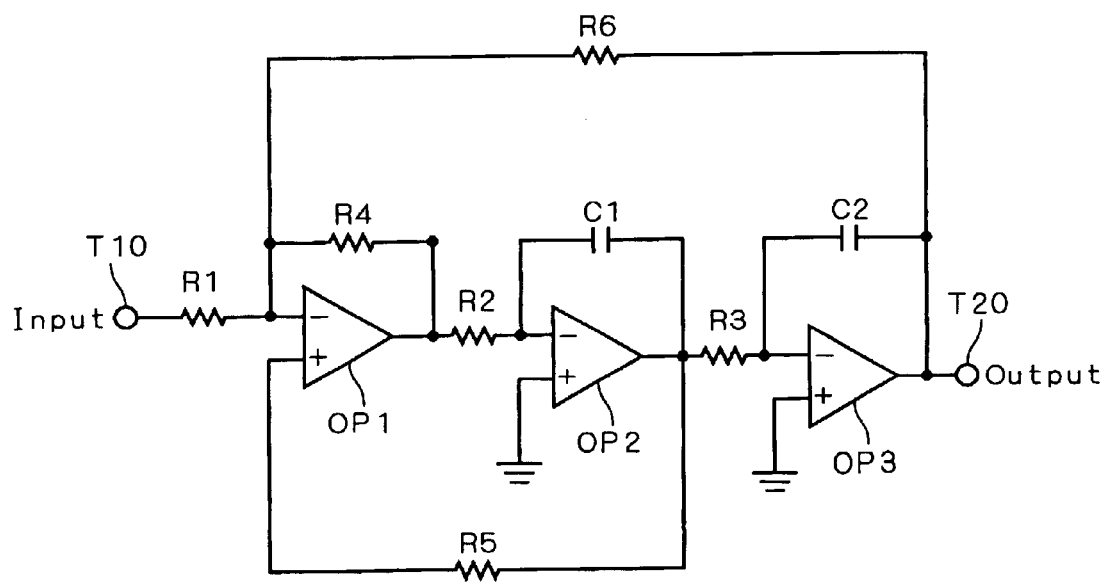

FIG. 38 shows a converter circuit for converting a current into a voltage.

In FIG. 38, the input terminal T10 is connected to the inverting input terminal of the operational amplifier OP, the feedback resistor Rf is interposed between the inverting input terminal of the operational amplifier OP and the terminal T20, and the noninverting input terminal of the operational amplifier OP is connected to the ground potential.

Assuming herein that an input current Is is equal to the current If flowing across the feedback resistor Rf, the output voltage V0 is expressed by the following equations (49) and (50):

$$V_0 = -IfRf \quad (49)$$

$$V_0 = -IsRf \quad (50)$$

From Eqs. (49) and (50), it is found that the output voltage Vo depends only on the input current Is and the feedback resistance Rf, regardless of the load impedance or the impedance of the signal source.

In this case, by using a variable resistance including at least one magnetic tunnel resistance element (e.g., the variable resistance Rx discussed with reference to FIG. 18) to constitute the feedback resistor Rf, it is possible to obtain the output voltage Vo having an arbitrary magnitude.

Further, the magnetic tunnel resistance elements discussed in the application examples of the first and second preferred embodiments of the present invention are formed on a semiconductor chip, a motherboard, an organic film on which an electric circuit is printed or the like.

For forming a semiconductor device, conventional substrates, such as a silicon substrate, a SOI (Silicon On Insulator) substrate and a SON (Silicon On Nothing) substrate, are used.

Furthermore, though the operational amplifier is shown as an example of the amplifier in the application examples of the first and second preferred embodiments of the present invention, besides the operational amplifier, an noninverting amplifier, an inverting amplifier, a differential amplifier and the like may be used singly or in combination.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory device at least comprising:
    an analog circuit having a variable resistance unit which consists of a plurality of magnetic tunnel resistance elements and obtains a plurality of kinds of resistance values by using said plurality of magnetic tunnel resistance elements singly or in combination and changing said resistance values of said plurality of magnetic tunnel resistance elements by single ones or combinations, being capable of changing said resistance values of said plurality of magnetic tunnel resistance elements by single ones or combinations with a plurality of control signals;
    a control unit for outputting said plurality of control signals; and
    a memory cell array,
    said semiconductor memory device adopting address signal multiplexing in which an address terminal is properly used in a time-division manner,
    wherein said control unit uses an address decoder of said memory cell array also as a decoder for resistance-value control of at least one of said plurality of magnetic tunnel resistance elements, and
    said address decoder is controlled on the basis of a magnetic tunnel resistance element control signal which is given to said address terminal in a time-division manner, for said resistance-value control of said at least one magnetic tunnel resistance element.

2. The semiconductor memory device according to claim 1, wherein
    said address decoder is a word line decoder.

3. The semiconductor memory device according to claim 1, wherein
    said address decoder is a bit line decoder.

4. The semiconductor memory device according to claim 1, wherein
    said analog circuit is a filter for filtering an input signal,
    said semiconductor memory device further comprising:
        at least one of a capacitor and an inductor,
        wherein said variable resistance unit is connected to at least one of said capacitor and said inductor.

5. The semiconductor memory device according to claim 1, wherein
    said analog circuit is an amplifier device for amplifying an input signal,
    said semiconductor memory device further comprising:
        an amplifier,
        wherein said variable resistance unit is electrically connected to an input of said amplifier.

6. The semiconductor memory device according to claim 1, wherein
    said analog circuit is a differential amplifier,
    said semiconductor memory device further comprising:
        an operational amplifier,
        said variable resistance unit is connected between a noninverting input and an output of said operational amplifier and/or between an inverting input and said output of said operational amplifier.

7. The semiconductor memory device according to claim 1, wherein
    said analog circuit is a comparator,
    said semiconductor memory device further comprising:
        an operational amplifier,
        said variable resistance unit is connected between a noninverting input and an output of said operational amplifier and/or to said noninverting input of said operational amplifier.

8. The semiconductor memory device according to claim 1, wherein
    said analog circuit is a current/current converter circuit for converting an input voltage into a current and outputting said current,
    said semiconductor memory device further comprising:
        an amplifier; and
        a load resistor connected between an input and an output of said amplifier,
        wherein said variable resistance unit is electrically connected to said input of said amplifier.

9. The semiconductor memory device according to claim 1, wherein
    said analog circuit is an analog computer including at least any of an adder, an integrator, a multiplier and a differentiator being connected in loop, and
    said variable resistance unit serves as a resistance element which is a constituent element of at least any of said adder, said integrator, said multiplier and said differentiator.

* * * * *